United States Patent
Wang et al.

(10) Patent No.: US 8,170,507 B2
(45) Date of Patent: May 1, 2012

(54) PREDISTORTION METHODS AND APPARATUS FOR TRANSMITTER LINEARIZATION IN A COMMUNICATION TRANSCEIVER

(75) Inventors: Yongtao Wang, Plano, TX (US);
Khurram Waheed, Plano, TX (US);
Sameh S. Rezeq, Dallas, TX (US);
Jaimin Mehta, Plano, TX (US); Prasad Srinivasan, Irving, TX (US); Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 612 days.

(21) Appl. No.: 12/260,832

(22) Filed: Oct. 29, 2008

(65) Prior Publication Data
US 2010/0105338 A1  Apr. 29, 2010

(51) Int. Cl.
*H04B 1/04* (2006.01)
(52) U.S. Cl. .................................. 455/114.3; 375/297
(58) Field of Classification Search ............. 330/149; 375/297; 455/114.3
See application file for complete search history.

(56) References Cited

U.S. PATENT DOCUMENTS

| | | | |
|---|---|---|---|
| 6,831,954 B1 | 12/2004 | Mandyam | |
| 6,934,341 B2 * | 8/2005 | Sahlman | 375/297 |
| 7,778,345 B2 * | 8/2010 | Sperlich et al. | 375/285 |
| 7,957,707 B2 * | 6/2011 | Staudinger et al. | 455/114.2 |
| 2004/0151257 A1 | 8/2004 | Staszewski et al. | |
| 2007/0190952 A1 * | 8/2007 | Waheed et al. | 455/114.3 |

* cited by examiner

*Primary Examiner* — Henry Choe
(74) *Attorney, Agent, or Firm* — Ronald O. Neerings; Wade James Brady, III; Frederick J. Telecky, Jr.

(57) ABSTRACT

Predistortion methods and apparatus for transmitter linearization in a communication transceiver are disclosed. An example apparatus to linearize a digitally controlled pre-power amplifier included in a transmitter of a communication transceiver disclosed herein comprises a predistorter to predistort an input signal to be processed by the digitally controlled pre-power amplifier, a coupling path within the communication transceiver to couple an output of the digitally controlled pre-power amplifier to an input of a receiver included in the communication transceiver without enabling an output power amplifier stage of a multi-stage power amplifier coupled to an output of the digitally controlled pre-power amplifier, wherein no additional hardware components are required to implement the coupling path within the communication transceiver, and a predistortion evaluator comprising a predistortion calibrator and a predistortion compensator to process data demodulated by the receiver to generate and update predistortion values for use by the predistorter.

19 Claims, 6 Drawing Sheets

PREDISTORTION METHODS AND APPARATUS FOR TRANSMITTER LINEARIZATION IN A COMMUNICATION TRANSCEIVER

FIELD OF THE DISCLOSURE

This disclosure relates generally to communication transceivers and, more particularly, to predistortion methods and apparatus for transmitter linearization in a communication transceiver.

BACKGROUND

Many modern wireless communication standards employ digital modulation yielding transmission signals having non-constant envelopes to improve spectral efficiency. To implement one or more of these wireless standards, an integrated communication transceiver may employ a digitally controlled pre-power amplifier (DPA) to amplitude modulate an already phase-modulated input signal to yield a composite modulated signal having non-constant envelope for transmission through a power amplifier (PA). However, many DPAs exhibit nonlinear characteristics which can cause distortion of the amplitude modulation (AM) and/or phase modulation (PM) of the composite modulated signal, with the distortion depending on the amplitude applied to the DPA. Such AM/AM distortion and/or AM/PM distortion, if unchecked, may cause the resulting transmitted signal to fail the typically stringent transmit spectral requirements imposed by modern communication standards, such as requirements for error vector magnitude (EVM), adjacent channel leakage ratio (ACLR), adjacent channel power ratio (ACPR), etc., of the transmitted non-constant envelope signal. At least some conventional techniques to counteract, or "linearize," the nonlinear characteristics of the DPA require external equipment and/or additional hardware in the communication transceiver itself to measure the DPA's nonlinear characteristics. Accordingly, many of these, as well as other, conventional techniques require a signal to be emitted by the transceiver during DPA linearization.

SUMMARY

The methods and apparatus described herein relate generally to communication transceivers and, more particularly, to predistortion methods and apparatus for transmitter linearization in a communication transceiver. For example, transmitter linearization is performed using predistortion to linearize a power amplifier driver, such as a DPA, included in the transmitter for driving a PA, such as a multi-stage PA, coupled to the output of the transmitter. In an example implementation, a communication transceiver includes a predistorter to predistort an input signal to be processed by the transmitter's DPA. The example communication transceiver also includes a radiated or conductive coupling path within the communication transceiver to couple an output of the DPA to a low noise amplifier (LNA) input of a receiver included in the communication transceiver without enabling an output PA stage included in the multi-stage PA coupled to the output of the DPA. No additional hardware components are required to implement the coupling path within the example communication transceiver. Furthermore, the example apparatus includes a predistortion evaluator to process data demodulated by the receiver to determine predistortion values for use by the predistorter. To ensure proper loading of the DPA when the predistortion values are being determined by the predistortion evaluator, one or more intermediate PA stages of the multi-stage PA may be enabled while leaving the output PA stage disabled.

Additionally, an example predistortion evaluator included the example communication transceiver implements a predistortion calibrator and a predistortion compensator. An example predistortion calibrator performs an initial calibration procedure to determine a plurality of predistortion values corresponding respectively to a plurality of input calibration values applied to the DPA. An example predistortion compensator performs a subsequent compensation procedure to estimate one or more parameters of one or more parametric expressions characterizing a distortion exhibited by the DPA and to evaluate the parametric expression(s) to update the plurality of predistortion values determined by the initial calibration procedure. In such an example implementation, the predistortion calibrator performs the initial calibration procedure during initialization of the communication transceiver, whereas the predistortion compensator performs the compensation procedure during normal operation of the communication transceiver.

DETAILED DESCRIPTION

Figure 1:
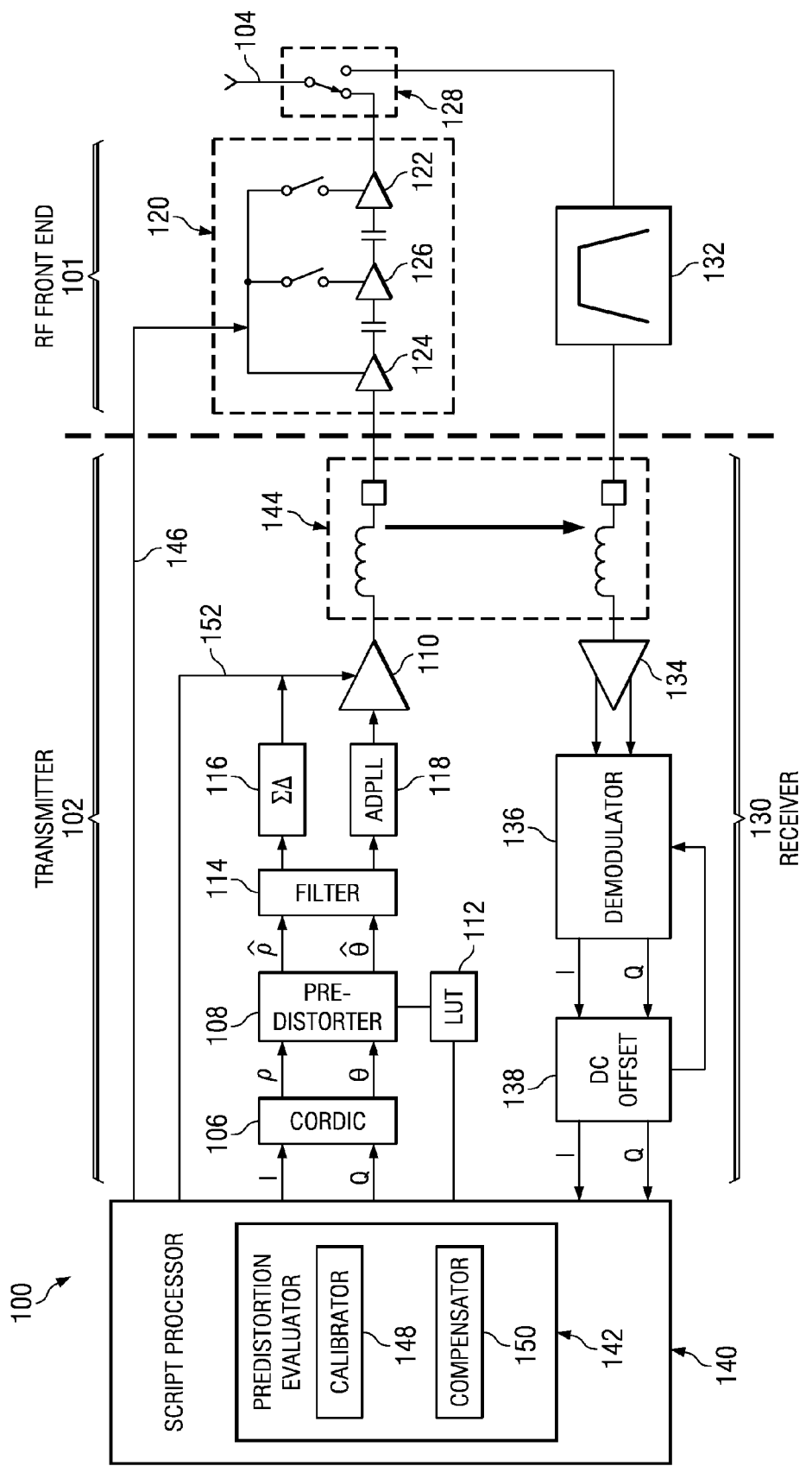
FIG. 1 is a block diagram of an example communication transceiver capable of supporting the example predistortion methods and apparatus described herein to perform transmitter linearization.

Predistortion methods and apparatus for transmitter linearization in a communication transceiver are described herein. The example predistortion methods and/or apparatus perform transmitter linearization by using predistortion to linearize a transmitter's power amplifier driver, such as a DPA, and may be adapted for use by almost any type of communication transceiver or similar communication device. Furthermore, the example predistortion methods and/or apparatus may be implemented by Texas Instruments Digital Radio Processor (DRP)™ technology and/or one or more circuit(s), programmable processor(s) and/or digital signal processor(s) (DSP(s)) executing software and/or firmware, application specific integrated circuit(s) (ASIC(s)), programmable logic device(s) (PLD(s)), field programmable logic device(s) (FPLD(s)), etc.

An example communication transceiver implemented according to the methods and/or apparatus described herein performs an initial self-calibration procedure to determine a plurality of AM predistortion values to counteract AM/AM distortion of an input signal by the DPA and a plurality of PM predistortion values to counteract AM/PM distortion of the input signal by the DPA. One or more look-up tables (LUTs) may be used to store the AM/AM and AM/PM predistortion values for subsequent retrieval to predistort the amplitude and/or phase of an input signal to be processed by the DPA. That is, the input to the DPA is predistorted in a manner that will be corrected by the distortion of the DPA. This results in a DPA output signal having reduced distortion.

The AM/AM and AM/PM predistortion values are determined by coupling the DPA to an LNA at the input of a receiver in the communication transceiver, applying a sequence of input calibration data that spans a range of input calibration values to the DPA and then using the received DPA output as calibration data to determine the AM/AM and AM/PM distortion exhibited by the DPA. The example calibration procedure is a self-calibration procedure because no external hardware or control is required to perform the procedure. Instead, a coupling path internal to the communication transceiver is used to couple the DPA to the LNA. The coupling path may be implemented, for example, by radiated and/or conducted coupling between the DPA and the LNA, such as leakage current arising from parasitic coupling between the DPA and the LNA, or a dedicated trace between the DPA and the LNA. Furthermore, in an example implementation, one or more intermediate PA stages coupling the DPA with the output PA stage are enabled, while leaving the output PA stage disabled. The output PA stage is disabled to prevent any typically high-power signals from being emitted by the output PA stage which could corrupt the radiated and/or conducted internal coupling path in the communication transceiver being used to determine the AM/AM and AM/PM distortion of the DPA. However, at least one intermediate PA stage is enabled to ensure proper loading of the DPA during predistortion value determination. Furthermore, the calibration procedure may be implemented by a script processor or similar processing element in the communication transceiver, thereby requiring no external intervention.

The example communication transceiver further performs one or more subsequent self-compensation procedures to update the predistortion values determined by the initial self-calibration procedure. For example, during each compensation procedure, one or more parameters of one or more parametric expression(s) characterizing the AM/AM and AM/PM distortion exhibited by the DPA are estimated. Additionally, the parametric expression(s) are evaluated to update the plurality of predistortion values determined by the initial self-calibration procedure. Similar to the self-calibration procedure, the parameters(s) are estimated in the self-compensation procedure by coupling the DPA to the LNA, applying a sequence of input compensation data that spans a range of input compensation values to the DPA and then using the received DPA output as compensation data to estimate the distortion parameter(s). However, because parametric expression(s) are used in the compensation procedure to represent the distortion exhibited by the DPA, typically fewer data samples are needed to estimate the distortion parameter(s) than are required by the calibration procedure to determine all of the predistortion values. This can result in a lower processing load and/or less processing time for compensation than for calibration, thereby allowing compensation to be performed during normal operation of the communication transceiver, whereas calibration may only be capable of being performed during initialization of the communication transceiver.

Like the example self-calibration procedure, the example compensation procedure is a self-compensation procedure because no external hardware or control is required to perform the procedure. For example, the same coupling path implementation may be used for both the calibration and compensation procedures. Furthermore, the compensation procedure, as well as the calibration procedure, may be implemented by a script processor or similar processing element in the communication transceiver, thereby requiring no external intervention.

Such example self-calibration and self-compensation procedures, as well as the associated example predistortion methods and/or apparatus to linearize power amplifiers, provide advantages over conventional linearization techniques, at least in some example implementations. For example, the predistortion methods and/or apparatus described herein can be implemented completely within the associated communication transceiver (e.g., by the internal coupling path and the script processor discussed above), thereby requiring no extra hardware or external intervention. Furthermore, the example self-calibration and self-compensation procedures are able to determine predistortion values for DPA linearization without causing or requiring any emissions from an output PA stage. Thus, the example self-calibration and self-compensation procedures may be performed even during normal operation of the associated communication transceiver, rather than during only factory testing or other pre-consumer use of the communication transceiver, thereby allowing the predistortion values to be updated to compensate for operating temperature, aging, and/or any other variation of the DPA. Furthermore, one or more intermediate PA stages coupling the DPA with the output PA stage may be enabled while leaving the output PA stage disabled to ensure proper loading of the DPA during predistortion calibration and compensation. By enabling the one or more intermediate PA stages, distortion due to voltage standing wave ratio (VSWR) changes at the interface between the DPA and intermediate PA(s) may also be reduced during predistortion calibration and/or compensation. Additionally, the use of parametric estimation and parametric expression(s) can significantly reduce the execution time and processing requirements of the example self-compensation procedure, thus allowing compensation to be performed along with other conventional processing being performed during normal operation of the communication transceiver.

Turning to the figures, a block diagram of an example communication transceiver 100 capable of supporting the example predistortion methods and apparatus described herein to linearize a power amplifier is illustrated in FIG. 1. The example communication transceiver is coupled to an example radio frequency (RF) front end 101. The example communication transceiver 100 includes an example transmitter 102 to transmit an information bearing signal via the example antenna 104 coupled to the example RF front end 101. In the illustrated example, the transmitter 102 digitally modulates in-phase (I) input and quadrature (Q) baseband signals to generate a transmit signal having non-constant envelope for transmission via the example antenna 104. The modulation may be performed according to any wireless communication standard, such as the global system for mobile communications standard (GSM), the general packet radio service standard (GPRS), the enhanced data rates for GSM evolution standard (EDGE), a code division multiple access standard (CDMA), a wideband CDMA (WCDMA) standard, etc. Alternatively, the example antenna 104 may be replaced by a wired connection (not shown) and the modulation performed according to any appropriate wired communication standard.

To perform the requisite digital modulation, the example transmitter 102 employs an all-digital polar (i.e., magnitude and phase) architecture to both AM and PM modulate the input I and Q baseband signals to generate the non-constant envelope transmission signal. In particular, the transmitter 102 of the illustrated example includes a coordinate rotation digital computer (CORDIC) unit 106 to convert input I and Q baseband signal samples into corresponding magnitude ($\rho$) and phase ($\theta$) baseband signal samples using the well-known CORDIC technique. As described in detail below, the resulting magnitude and phase baseband samples output by the example CORDIC unit 106 are predistorted by an example predistorter 108 to produce modified magnitude ($\hat{\rho}$) and phase samples ($\hat{\theta}$) to counteract nonlinear distortion introduced by a DPA 110 included in the example transmitter 102. By predistorting the input magnitude and phase baseband samples to counteract the nonlinear distortion exhibited by the example DPA 110, the example predistorter 108 causes the DPA 110 to exhibit a more linear behavior or, in other words, the example predistorter 108 linearizes the DPA 110. Operation of the example DPA 110 is discussed in greater detail below.

Figure 2:
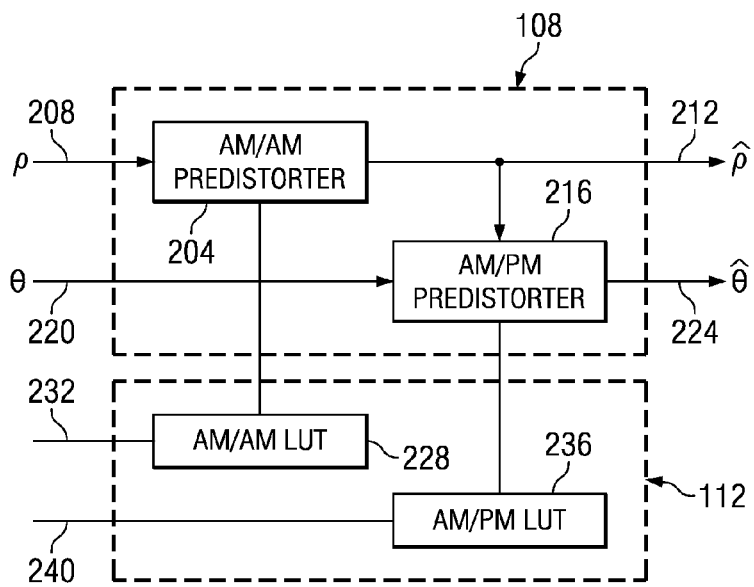
FIG. 2 is a block diagram of an example predistorter that may be used to implement the example communication transceiver of FIG. 1.

In the illustrated example, the predistorter 108 is configured to counteract both AM/AM and AM/PM distortion introduced by the example DPA 110. However, in other example implementations the predistorter 108 could be configured to counteract either AM/AM distortion or AM/PM distortion, or even some other type of distortion. To perform predistortion, the example predistorter 108 accesses one or more look-up tables (LUTs) 112 storing a plurality of predistortion values used to counteract the distortion that the example DPA 110 is expected to introduce. In general, the nonlinear distortion exhibited by the example DPA 110 is amplitude dependent and, therefore, depends on an amplitude or gain applied to the DPA 110. Accordingly, in the illustrated example, each predistortion value specifies a respective predistortion of an input magnitude and phase to counteract an expected distortion corresponding to the amplitude/gain to be applied to the example DPA 110. For example, the example LUT(s) 112 may include a plurality of AM predistortion values to counteract AM/AM distortion exhibited by the example DPA 110, as well as a plurality of PM predistortion values to counteract AM/PM distortion exhibited by the example DPA 110. In such an example, the predistorter 108 accesses the LUT(s) 112 to select a particular AM predistortion value and a particular PM predistortion value, each corresponding to the input magnitude baseband sample obtained from the example CORDIC unit 106. The example predistorter 108 then uses the selected AM predistortion value to predistort the input magnitude sample ($\rho$) to counteract AM/AM distortion by the example DPA 110. Similarly, the example predistorter 108 uses the selected PM predistortion value to predistort the input phase sample ($\theta$) obtained from the example CORDIC unit 106 to counteract AM/PM distortion by the example DPA 110. For example, depending upon a particular implementation, the predistorter 108 may replace the input magnitude sample with the selected AM predistortion value, scale the input magnitude sample by the selected AM predistortion value, etc. Similarly, depending upon a particular implementation, the example predistorter 108 may replace the input phase sample with the selected PM predistortion value, rotate the input phase sample by the selected PM predistortion value, etc. An example implementation of the predistorter 108 is illustrated in FIG. 2 and discussed in greater detail below.

To AM and PM modulate the predistorted magnitude and phase samples produced by the example predistorter 108, the example transmitter 102 further includes an interpolation filter 114, a sigma-delta ($\Sigma\Delta$) modulator 116 and an all digital phase locked loop (ADPLL) 118. The example interpolation filter 114 operates to increase the sampling resolution of the magnitude and phase samples (e.g., ($\hat{\rho}, \hat{\theta}$)) undergoing modulation. In the illustrated example, the interpolation filter 114 is implemented by a cascaded integrator comb (CIC) interpolation filter, but any other interpolation topology may alternatively be used.

Next, the example $\Sigma\Delta$ modulator 116 AM modulates the interpolated magnitude samples output by the example interpolation filter 114, and the example ADPLL 118 PM modulates the interpolated phase samples output by the example interpolation filter 114. To perform AM modulation, the example $\Sigma\Delta$ modulator 116 converts input magnitude samples into corresponding amplitude control words for controlling the example DPA 110. To perform PM modulation, the ADPLL 118 employs a phase locked loop to modulate a phase of a digitally controlled oscillator (DCO) according to input phase samples applied to the ADPLL 118. In an example implementation, the DCO included in the ADPLL 118 is implemented by a digitally controlled crystal oscillator (DCXO). The resulting PM modulated signal produced by the example ADPLL 118 is input to the example DPA 110, which AM modulates the same.

As noted above, the example DPA 110 included in the example transmitter 102 amplifies an input signal according to an applied amplitude control word. Thus, in the illustrated example, the DPA 110 amplifies the PM modulated signal produced by the example ADPLL 118 according to the amplitude control words produced by the example $\Sigma\Delta$ modulator 116. As discussed above, the example DPA 110 typically exhibits amplitude dependent nonlinear distortion characteristics. For example, the DPA 110 may distort the amplitude and/or phase of its input signal differently depending on the applied amplitude control word. However, in the illustrated example, the applied amplitude control word and the phase of the input signal are predistorted by the example predistorter 108 as described above to counteract the nonlinear distortion exhibited by the example DPA 110. As a result, the non-constant envelope modulated signal output by the example DPA 110 is an AM and PM modulated version of the original magnitude and phase samples produced by the example CORDIC unit 106 which potentially exhibits little to no nonlinear distortion.

The example transmitter 102 is coupled to a multi-stage PA 120 in the example RF front end 101 to prepare the signal output by the example DPA 110 for transmission via the example antenna 104. One or more transmit conditioning filters (not shown) may also be interposed between the transmitter 102 and the multi-stage PA 120. In the illustrated example, the example multi-stage PA 120 includes an output PA stage 122 and two intermediate PA stages 124 and 126. Each of the PA stages 122, 124 and 126 of the illustrated example can be enabled or disabled individually. The output PA stage 122 is coupled to the example antenna 104 through a transmit/receive (T/R) switch 128 included in the example RF front end 101. In the illustrated example, the example T/R switch 128 allows the antenna 104 to be shared by the example transmitter 102 and an example receiver 130 also included in the example transceiver 100. Thus, the example transceiver 100 of FIG. 1 supports half-duplex radio frequency (RF) communications in which transmission and reception are mutually exclusive. However, the methods and apparatus described herein may also be used in transceivers supporting full-duplex communications in which transmission and reception may occur simultaneously.

Because the example transceiver 100 supports both signal transmission and reception, the transceiver 100 includes the example receiver 130 in addition to the example transmitter 102. The example receiver 130 operates as a counterpart of the example transmitter 102 to receive a non-constant envelope modulated signal conforming to the communication standard supported by the example transmitter 102. For example, the receiver 130 may be implemented to support any wireless or wired communication standard. In the illustrated example, the receiver 130 is configured to support wireless communications and receives an RF signal via the example antenna 104 after appropriate coupling by the example T/R switch 128. The example receiver 130 then operates to filter and digitally demodulate the received RF signal to produce resulting demodulated baseband I and Q samples corresponding to an information signal conveyed by the received RF signal.

To perform the requisite filtering and digital demodulation, the example receiver 130 is coupled to a front end receive filter 132 included in the example front end 101 which is configured to remove out-of-band signal components from the received RF signal. In the illustrated example, the front end receive filter 132 is implemented by a surface acoustic wave (SAW) filter, but any other type of front end filter topology may alternatively be used. The example receiver 130 includes a low noise amplifier (LNA) 134 to amplify the typically weak received RF signal output by the example front end receive filter 132 for processing by an example demodulator 136. The example LNA 134 operates to amplify the received RF signal while introducing minimal noise to yield a desirable noise figure for the example receiver 130.

The example receiver 130 further includes an example demodulator 136 to digitally demodulate the filtered and amplified received RF signal to produce the resulting demodulated baseband I and Q samples corresponding to an information signal conveyed by the received RF signal. In the illustrated example, the demodulator 136 performs downconversion to translate the received RF signal to baseband, further filtering and amplification to condition the downconverted baseband signal for demodulation, and analog-to-digital conversion to sample the received baseband signal for digital processing. The resulting sampled received baseband signals are then processed to undo the modulation imposed on the received RF signal according to the particular implemented communication standard to yield the digitally demodulated baseband I and Q samples. Any type of digital demodulation technology may be used to implement the example demodulator 136.

To improve performance of the example demodulator 136, the example receiver 130 includes a direct current (DC) offset compensator 138 to mitigate or cancel DC offset error that may be introduced in the receive processing performed by the receiver 130. To mitigate or cancel DC offset in the received signal, the example DC offset compensator 138 estimates the DC offset error in the digitally demodulated baseband I and Q samples output from the example demodulator 136 and then feeds back the estimated error to the demodulator 136. The example demodulator 136 can then use the estimated DC offset provided by the example DC offset compensator 138 to mitigate or cancel the introduced DC offset, for example, by subtracting the estimated DC offset from the received signal prior to analog-to-digital conversion and sampling. The example DC offset compensator 138 may be implemented in hardware and/or by a digital processor (not shown), such as a digital signal processor (DSP), included in the example transceiver 100.

To control operation of the example transmitter 102, the example receiver 130 and the example T/R switch 104, as well as to perform other transceiver processing, the example transceiver 100 further includes a script processor 140. Additionally, the script processor 140 is configured to implement a predistortion evaluator 142 to support linearization of the example DPA 110. In the illustrated example, the script processor 140 implements the example predistortion evaluator 142 to determine the AM and PM predistortion values discussed above that are to be stored in the example LUT(s) 112 for use by the example predistorter 108 to counteract AM/AM and AM/PM distortion introduced by the example DPA 110. The example predistortion evaluator 142 operates to determine the AM/AM and AM/PM distortion characteristics of the example DPA 110 by processing demodulated baseband I and Q samples output from the example demodulator 136 and resulting from coupling back a transmit signal generated by the example transmitter 102 for known input I and Q baseband signal samples. The example predistortion evaluator 142 then uses the determined AM/AM and AM/PM distortion characteristics to generate and/or update respective AM and PM predistortion values to compensate for such distortion characteristics. Although depicted as being implemented by the example script processor 140 in the illustrated example, the example predistortion evaluator 142 could additionally or alternatively be implemented in hardware, such as by any combination of digital logic, circuitry, ASIC(s), PLD(s), FPLD(s), etc.

To couple the example transmitter 102 to the example receiver 130 to allow the example predistortion evaluator 142 to perform AM/AM and AM/PM distortion determination, the example transceiver 100 implements an internal coupling path 144. The example internal coupling path 144 couples the example DPA 110 of the transmitter 102 to the example LNA 134 of the receiver 130 without requiring any additional external hardware. In the illustrated example, the internal coupling path 144 is implemented by leakage current arising from parasitic coupling between the DPA 110 and LNA 134. Alternatively, the example internal coupling path 144 could be implemented by one or more dedicated traces (e.g., such as substrate and/or package traces) between the DPA 110 and LNA 134. Additionally, in the illustrated example, the internal coupling path 144 is intended to operate with the example multi-stage 120 partly enabled. In particular, the example internal coupling path 144 is intended to operate with one or more of the example intermediate PA stages 124 and 126 enabled, but with the example output PA stage 122 disabled. Such control of the output PA stage 122 and the intermediate PA stages 124 and 126 is achieved through a front end control signal 146 that is configurable by the example script processor 140 (and, thus, is configurable by the example predistortion evaluator 142). By operating the internal coupling path 144 with the example output PA stage 122 disabled, no signals are emitted by the example antenna 104 that could impact the typically stringent transmit spectral requirements imposed by modern communication standards. However, by operating the internal coupling path 144 with the one or more of the example intermediate PA stages 124 and 126 enabled, the example DPA 110 will be properly loaded when the example predistortion evaluator 142 is determining the distortion characteristics of the DPA 110.

To determine the AM/AM and AM/PM distortion characteristics of the example DPA 110 and to generate/update the corresponding AM and PM predistortion values, the example predistortion evaluator 142 includes a predistortion calibrator 148 and a predistortion compensator 150. In the illustrated example, the predistortion calibrator 148 is configured to perform an example calibration procedure implementing an exhaustive determination of the AM/AM and AM/PM distortion characteristics of the example DPA 110 and generation of the corresponding AM and PM predistortion values, whereas the predistortion compensator 150 is configured to perform an example compensation procedure implementing a less intensive determination of the AM/AM and AM/PM distortion characteristics of the example DPA 110 and updating of the corresponding AM and PM predistortion values. Accordingly, in an example implementation, the example predistortion calibrator 148 is operable during initialization or factory testing of the example transceiver 100, whereas the example predistortion compensator 150 is operable during normal operation of the example transceiver 100 (e.g., such as when the example transceiver 100 has been initialized and is operable in an associated commercial device). The example predistortion calibrator 148 and the example predistortion compensator 150 can operate during initialization and normal operation, respectively, of the example transceiver 100 because, as discussed in greater detail below, the example internal coupling path 144 couples the example transmitter 102 and the example receiver 130 without causing emission of any signals via the example antenna 104.

The example predistortion calibrator 148 included in the example predistortion evaluator 142 implements the example initial self-calibration procedure described above to generate the plurality of AM and PM predistortion values stored in the example LUT(s) 112 for use by the example predistorter 108 to counteract AM/AM and AM/PM distortion of the input magnitude and phase baseband signals by the example DPA 110. In the illustrated example, each AM and each PM predistortion value corresponds to a respective amplitude value that could be applied as the amplitude control word of the example DPA 110. With this in mind, the example predistortion calibrator 148 determines the AM and PM predistortion values, at least in part, by enabling one or more of the example intermediate PA stages 124 and 126 and disabling the example output PA stage 122 via the example front end control signal 146 to configure the example internal coupling path 144 to couple the DPA 110 to the LNA 134 of the example receiver 130. Then, the example predistortion calibrator 148 applies a sequence of input calibration data to the example DPA 110 that spans a range of input calibration amplitude values (possibly after applying an initial sequence to enable DC offset correction as discussed in greater detail below). For example, the range of input calibration values could span some or all of the operating range of the example DPA 110. In the illustrated example, the predistortion calibrator 148 applies a particular input calibration amplitude value to the example DPA via an example DPA amplitude control input 152 as shown.

Figure 3:
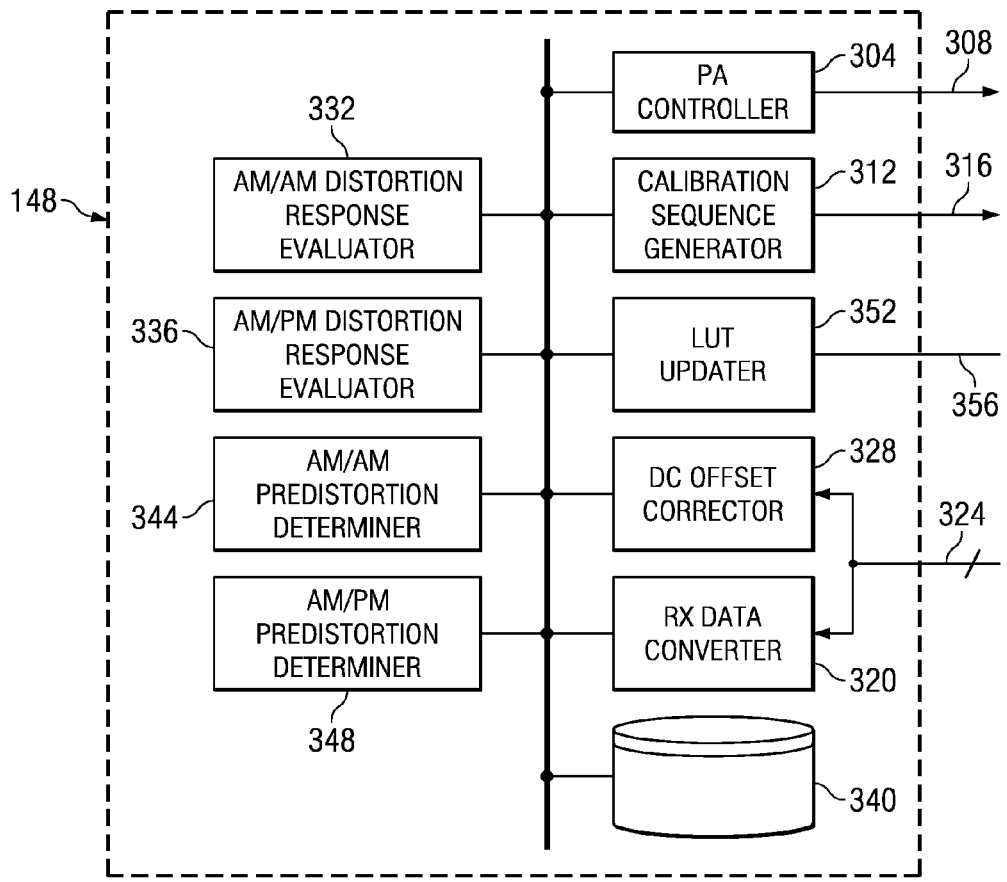
FIG. 3 is a block diagram of an example predistortion calibrator that may be used to implement the example communication transceiver of FIG. 1.

Next, the example predistortion calibrator 148 configures the example LNA 134, the example demodulator 136 and the example DC offset compensator 138 to receive and demodulate the resulting transmitted calibration signals output by the example DPA 110. The resulting demodulated I and Q calibration data is then processed by the example predistortion calibrator 148 to determine the AM/AM and AM/PM distortion exhibited by the DPA 110 corresponding to each input calibration amplitude value. For example, the predistortion calibrator 148 may compare the amplitude of a particular input calibration amplitude value applied to the DPA 110 to the magnitude of the resulting demodulated I and Q calibration data (possibly after adjustment for any scaling by the internal coupling path 144, LNA 134, demodulator 136, etc.) to determine the AM/AM distortion introduced by the DPA 110. Similarly, the predistortion calibrator 148 may compare the phase of the input signal amplified by DPA 110 (e.g., which could be fixed to be zero phase by appropriate control of the example ADPLL 118) to the phase of the resulting demodulated I and Q calibration data (possibly after adjustment for any phase rotation introduced by the internal coupling path 144, LNA 134, demodulator 136, etc.) to determine the AM/PM distortion introduced by the DPA 110. Additionally or alternatively, one or more parametric expressions having one or more distortion parameters estimated from the demodulated I and Q calibration data may be used by the example predistortion calibrator 148 to determine the AM/AM and AM/PM distortion introduced by the example DPA 110. In some example implementations, the predistortion calibrator 148 may repeat the sequence of input calibration data to allow the AM/AM and AM/PM distortion corresponding to each input calibration amplitude value to be determined by averaging multiple results. After the AM/AM and AM/PM distortion is characterized for all the input calibration amplitude values, the example predistortion calibrator 148 then generates appropriate AM and PM predistortion values for each input calibration amplitude value to be used for linearizing the DPA 110. The example predistortion calibrator 148 then stores the generated AM and PM predistortion values in the example LUT(s) 112 for use by the example predistorter 108. An example implementation of the predistortion calibrator 148 is illustrated in FIG. 3 and discussed in greater detail below.

The example predistortion compensator 150 included in the example predistortion evaluator 142 implements the example self-compensation procedure described above to update the plurality of AM and PM predistortion values stored in the example LUT(s) 112 for use by the example predistorter 108 to counteract AM/AM and AM/PM distortion of the input magnitude and phase baseband signals by the example DPA 110. The example self-compensation procedure implemented by the example predistortion compensator 150 estimates one or more parameters of one or more parametric expression(s) characterizing the AM/AM and AM/PM distortion exhibited by the DPA 110. After estimating these distortion parameter(s), the example predistortion compensator 150 evaluates the associated parametric expression(s) to update at least some of the AM and PM predistortion values stored in the example LUT(s) 112. With this in mind, the example predistortion compensator 150 estimates the distortion parameter(s), at least in part, by enabling one or more of the example intermediate PA stages 124 and 126 and disabling the example output PA stage 122 via the example front end control signal 146 to configure the example internal coupling path 144 to couple the DPA 110 to the LNA 134 of the example receiver 130. Then, the example predistortion compensator 150 applies a sequence of input compensation data to the example DPA 110 that spans a range of input compensation amplitude values (possibly after applying an initial sequence to enable DC offset correction as discussed in greater detail below). For example, the range of input compensation values could span all or a particular (e.g., critical) subset of the operating range of the example DPA 110 (e.g., such as a subset of the operating range known to experience highly variable distortion characteristics). In the illustrated example, the predistortion compensator 150 applies a particular input compensation amplitude value to the example DPA via the example DPA amplitude control input 152 as shown.

Figure 4:
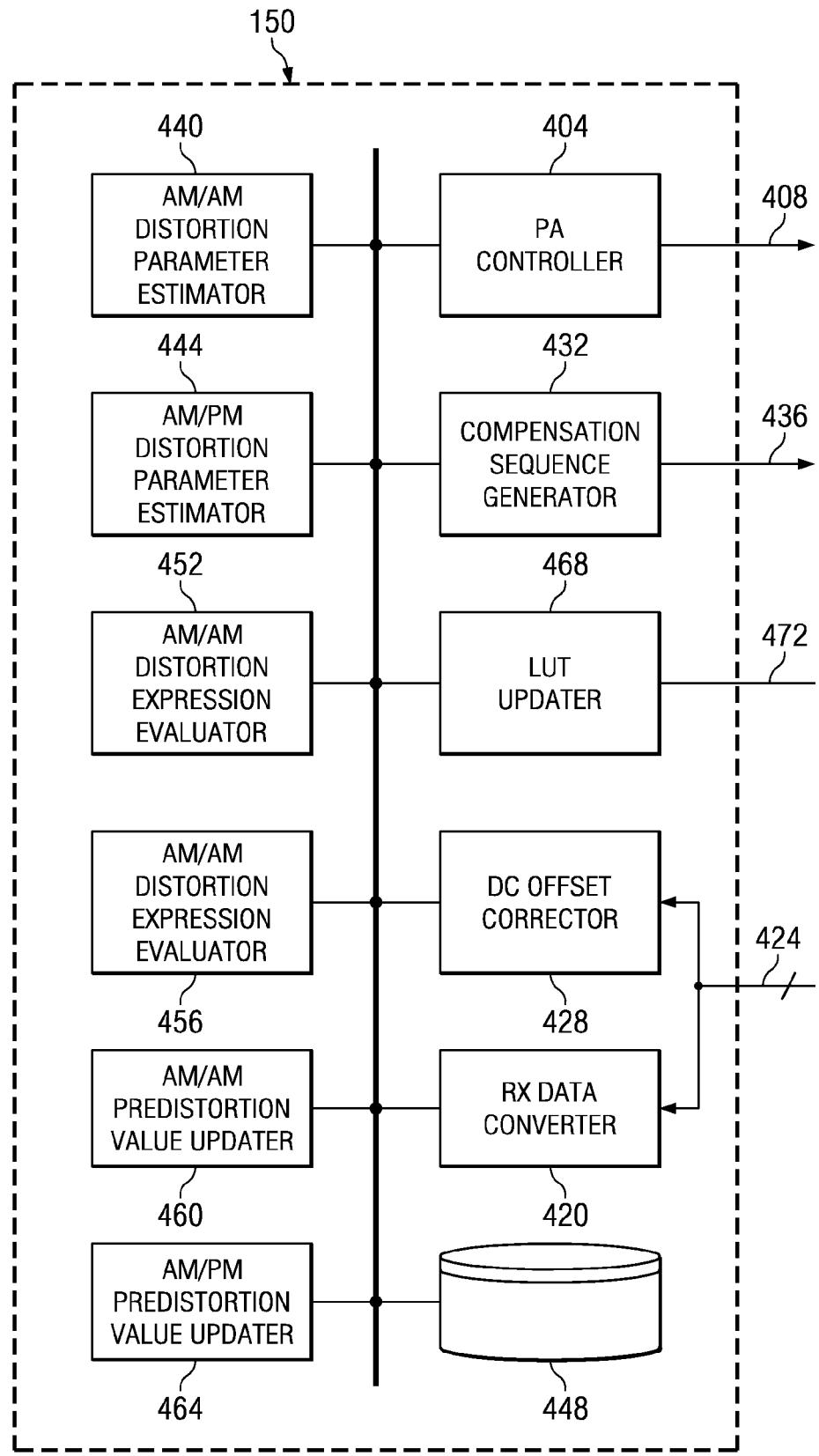
FIG. 4 is a block diagram of an example predistortion compensator that may be used to implement the example communication transceiver of FIG. 1.

Next, the example predistortion compensator 150 configures the example LNA 134, the example demodulator 136 and the example DC offset compensator 138 to receive and demodulate the resulting transmitted compensation signals output by the example DPA 110. The resulting demodulated I and Q compensation data is then processed by the example predistortion compensator 150 to estimate the distortion parameter(s) of the parametric expression(s) characterizing the AM/AM and AM/PM distortion exhibited by the DPA 110. For example, the predistortion compensator 150 may use one or more statistical estimate techniques, such as least squares polynomial or other curve fitting techniques, to estimate the distortion parameter(s) according to the type of parametric expression(s) used to characterize the AM/AM and AM/PM distortion exhibited by the DPA 110. Example types of parametric expression(s) include polynomial or other functional approximations, possibly along with multi-segment approximation, representing the AM/AM and AM/PM distortion relative input DPA amplitude. In some example implementations, the predistortion compensator 150 may repeat the sequence of input compensation data to allow the distortion parameter(s) to be estimated by averaging multiple results. After the distortion parameter(s) of the parametric expression(s) are estimated, the example predistortion compensator 150 then evaluates the parametric expression(s) to update one or more of the AM and PM predistortion values stored in the example LUT(s) 112. As discussed above, the example predistortion compensator 150 may operate repeatedly during normal operation of the example transceiver 100 to continue updating the AM and PM predistortion values as the AM/AM and AM/PM distortion characteristics of the example DPA 110 change over time (e.g., due to operating temperature changes, aging, etc.). An example implementation of the predistortion compensator 150 is illustrated in FIG. 4 and discussed in greater detail below.

A block diagram of an example implementation of the predistorter 108 included in the example communication transceiver 100 of FIG. 1 is illustrated in FIG. 2. In the illustrated example of FIG. 2, the example predistorter 108 includes an AM/AM predistorter 204 to predistort an input magnitude baseband sample ($\rho$) applied to a magnitude input 208. The resulting predistorted magnitude baseband sample ($\hat{\rho}$) determined by the AM/AM predistorter 204 is then provided at a predistorted magnitude output 212. In an example implementation, the predistorted magnitude output 212 is coupled to a gain input of a DPA, such as the amplitude control word input of the example DPA 110, thereby enabling the example predistorter 108 to perform DPA linearization by using an AM predistortion value to predistort the input magnitude baseband sample ($\rho$) applied to a magnitude input 208 to counteract AM/AM predistortion exhibited by the subject DPA.

In the illustrated example, the AM/AM predistorter 204 operates to access an AM/AM LUT 228 associated with the example LUT(s) 112 to select an appropriate AM predistortion value for use in predistorting a particular input magnitude baseband sample ($\rho$). The AM predistortion values stored in the example AM/AM LUT 228 are generated and/or updated via an AM/AM LUT configuration input 232. For example, the predistortion calibrator 148 and/or the predistortion compensator 150 of FIG. 1 may generate/update the AM predistortion values stored in the example AM/AM LUT 228 as described above.

In an example operation, the AM/AM predistorter 204 replaces the input magnitude baseband sample ($\rho$) applied to the magnitude input 208 with a particular AM predistortion value selected from the example AM/AM LUT 228 to counteract the AM/AM distortion characteristics of the example DPA 110. The example AM/AM predistorter 204 then outputs the selected AM predistortion value as the predistorted magnitude baseband sample ($\hat{\rho}$) provided by the predistorted magnitude output 212. For example, assume that a particular input magnitude baseband sample ($\rho$) has a value of $\rho_1$. Then, in an example operation, the AM/AM predistorter 204 accesses the example AM/AM LUT 228 and determines that, to transmit a signal having a baseband amplitude of $\rho_1$, an AM predistortion value of amplitude $\rho_2$ must be applied to the example DPA 110 to counteract its AM/AM distortion. Accordingly, the example AM/AM predistorter 204 selects the AM predistortion value of $\rho_2$ and outputs this value as the predistorted magnitude baseband sample ($\hat{\rho}$) to be provided by the predistorted magnitude output 212.

The example predistorter 108 of FIG. 2 also includes an AM/PM predistorter 216 to predistort an input phase baseband sample ($\theta$) applied to a phase input 220. The resulting predistorted phase baseband sample ($\hat{\theta}$) determined by the AM/PM predistorter 216 is then provided at a predistorted phase output 224. In an example implementation, the predistorted magnitude output 212 is coupled to a phase input of an ADPLL configured to drive a DPA, such as the example ADPLL 118 driving the example DPA 110, thereby enabling the example predistorter 108 to perform DPA linearization by using a PM predistortion value to predistort the input phase baseband sample ($\theta$) applied to a phase input 220 to counteract AM/PM predistortion exhibited by the subject DPA.

Similar to the example AM/AM predistorter 204, the example AM/PM predistorter 216 of the illustrated example operates to access an AM/PM LUT 236 associated with the example LUT(s) 112 to select an appropriate PM predistortion value for use in predistorting a particular input phase baseband sample ($\theta$). The PM predistortion values stored in the example AM/PM LUT 236 are generated and/or updated via an AM/PM LUT configuration input 240. For example, the predistortion calibrator 148 and/or the predistortion compensator 150 of FIG. 1 may generate/update the PM predistortion values stored in the example AM/PM LUT 236 as described above.

In an example operation, the AM/PM predistorter 216 replaces the input phase baseband sample ($\theta$) applied to the phase input 220 with a particular PM predistortion value selected from the example AM/PM LUT 236 to counteract the AM/PM distortion characteristics of the example DPA 110. The example AM/PM predistorter 216 then outputs the selected PM predistortion value as the predistorted phase baseband sample ($\hat{\theta}$) provided by the predistorted phase output 224. For example, assume that a particular input phase baseband sample ($\theta$) has a value of $\theta_1$ and the input magnitude baseband sample ($\rho$) has been predistorted by the example AM/AM predistorter 204 to have a predistorted magnitude of $\rho_2$ (e.g., according to the previously described example operation). Then, in an example operation, the AM/PM predistorter 216 accesses the example AM/PM LUT 236 and determines that, to transmit a signal having a baseband phase of $\theta_1$, a signal having phase $\theta_2$ must be input to the example DPA 110 to counteract its AM/PM distortion when the applied amplitude is $\rho_2$. Accordingly, the example AM/PM predistorter 216 selects the PM predistortion value of $\theta_2$ and outputs this value as the predistorted phase baseband sample ($\hat{\theta}$) to be provided by the predistorted phase output 224.

While an example manner of implementing the predistorter 108 of FIG. 1 has been illustrated in FIG. 2, one or more of the elements, processes and/or devices illustrated in FIG. 2 may be combined, divided, re-arranged, omitted, eliminated and/or implemented in any other way. Further, the example AM/AM predistorter 204, the example AM/PM predistorter 216, the example AM/AM LUT 228, the AM/PM LUT 236 and/or, more generally, the example predistorter 108 of FIG. 2 may be implemented by hardware, software, firmware and/or any combination of hardware, software and/or firmware. Thus, for example, any of the example AM/AM predistorter 204, the example AM/PM predistorter 216, the example AM/AM LUT 228, the AM/PM LUT 236 and/or, more generally, the example predistorter 108 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the appended claims are read to cover a purely software and/or firmware implementation, at least one of the example predistorter 108, the example AM/AM predistorter 204, the example AM/PM predistorter 216, the example AM/AM LUT 228 and/or the AM/PM LUT 236 are hereby expressly defined to include a tangible medium, such as a memory, storing such software and/or firmware. Further still, the example predistorter 108 of FIG. 2 may include one or more elements, processes and/or devices in addition to, or instead of, those illustrated in FIG. 2, and/or may include more than one of any or all of the illustrated elements, processes and devices.

A block diagram of an example implementation of the predistortion calibrator 148 included in the example communication transceiver 100 of FIG. 1 is illustrated in FIG. 3. For convenience and without loss of generality, the example predistortion calibrator 148 of FIG. 3 is described in the context of operation in the example communication transceiver 100 of FIG. 1. In the illustrated example of FIG. 3, the example predistortion calibrator 148 includes a PA controller 304 to control the example multi-stage PA 120 coupled to the example communication transceiver 100 to enable configuration of the example internal coupling path 144 for predistortion calibration processing. Accordingly, the example PA controller 304 provides a PA control output 308 for coupling to the front end control signal 146 of the example communication transceiver 100 to allow the example PA controller 304 to enable one or more of the intermediate PA stages 124 and 126 of the example multi-stage PA 120, while disabling the example output PA stage 122 of the example multi-stage PA 120. Such a configuration allows the example internal coupling path 144 to internally couple the example DPA 110 and the example LNA 134 of the example communication transceiver 100 with proper loading of the DPA 110 but without causing signal emission from example antenna 104.

To generate a sequence of input calibration data for use in performing predistortion calibration to determine the AM and PM predistortion values to be used for DPA linearization, the example predistortion calibrator 148 of FIG. 3 includes a calibration sequence generator 312. The example calibration sequence generator 312 operates to generate a sequence of input calibration data having calibration amplitude (or gain) values that span some or all of the operating range of the example DPA 110 to be linearized. As discussed above, the example calibration sequence generator 312 may repeat the sequence of input calibration data to allow averaging over multiple data samples and/or other filtering techniques to be used to mitigate measurement noise when determining the AM and PM predistortion values. In an example implementation, the sequence of input calibration data may be a staircase-like signal covering most, if not all, of the range of amplitude/gain values supported by the example DPA 110.

Additionally, the example calibration sequence generator 312 may be configured to generate an initial sequence of zero values to allow DC offset correction to be performed prior to application of the sequence of input calibration data. Such DC offset correction can improve accuracy of the determined AM and PM predistortion values. To apply the generated sequence of input calibration data, as well as the generated initial sequence of zero values if appropriate, to the example DPA 110, the example calibration sequence generator 312 provides a sequence generator output 316 for coupling to the DPA amplitude control input 152 of the example communication transceiver 100. Such a configuration allows the example calibration sequence generator 312 to directly control the sequence of calibration data (e.g., amplitude/gain values) applied to the gain input (or amplitude control word input) of the example DPA 110.

The example predistortion calibrator 148 of FIG. 3 further includes a receive (RX) data converter 320 to process received and demodulated I and Q calibration data corresponding to the sequence of input calibration data generated by the example calibration sequence generator 312. In the illustrated example, the RX data converter 320 obtains the demodulated I and Q calibration data via an RX data input 324. In an example implementation, the RX data input 324 may be coupled to an appropriate output of the example demodulator 136 or the example DC offset compensator 138 of the example communication transceiver 100. In such an example, the example PA controller 304 is used to configure the example internal coupling path 144 of the example communication transceiver 100 to allow the example demodulator 136 to receive and demodulate the sequence of input calibration data generated by the example calibration sequence generator 312 and modulated by the example transmitter 102 (as well as distorted by the example DPA 110). The example RX data converter 320 operates to convert the obtained demodulated I and Q calibration data to a polar representation, thus yielding demodulated magnitude and phase calibration data. The resulting demodulated magnitude and phase calibration data can then be processed to determine the distortion characteristics of a subject DPA being linearized by the example predistortion calibrator 148.

In some example implementations, the predistortion calibrator 148 may also include a DC offset corrector 328 to perform DC offset estimation and correction of the demodulated I and Q calibration data obtained via the RX data input 324. For example, the predistortion calibrator 148 may implement the example DC offset corrector 328 to support example implementations in which the communication transceiver 100 does not include the example DC offset compensator 138 and, thus, DC offset compensation of the demodulated I and Q calibration data is not performed automatically.

The example predistortion calibrator 148 of FIG. 3 also includes an AM/AM distortion response evaluator 332 and an AM/PM distortion response evaluator 336 to determine the AM/AM and AM/PM distortion characteristics, respectively, of a subject DPA, such as the example DPA 110 included in the example communication transceiver 100. In particular, the example AM/AM distortion response evaluator 332 operates to compare the demodulated magnitude data provided by the example RX data converter 320 with the respective input calibration data generated by the example calibration sequence generator 312 to determine the AM/AM distortion introduced by the example DPA 110. If appropriate, the comparison may be adjusted by any additional scale factors introduced by the transmitter 102 and/or receiver 130 of the example communication transceiver 100. Comparisons may be performed for each calibration amplitude/gain value included in the sequence of calibration data to yield a respective AM/AM distortion value for each calibration amplitude/gain value. The comparison results for multiple input and resulting demodulated data samples corresponding to the same calibration amplitude/gain value may be averaged and/or filtered to reduce measurement noise. After AM/AM distortion values are determined for the range of possible calibration amplitude/gain values, the example AM/AM distortion response evaluator 332 stores the determined AM/AM distortion values in a calibration storage unit 340. The example calibration storage unit 340 may be implemented by any type of storage unit, memory elements, digital logic, or the like.

Similarly, the example AM/PM distortion response evaluator 336 operates to compare the demodulated phase data provided by the example RX data converter 320 with the respective input calibration data generated by the example calibration sequence generator 312 (e.g., which could be fixed to be zero phase by appropriate control of the example ADPLL 118) to determine the AM/PM distortion introduced by the example DPA 110. If appropriate, the comparison may be adjusted by any additional phase error introduced by the transmitter 102 and/or receiver 130 of the example communication transceiver 100. Comparisons may be performed for each calibration amplitude/gain value included in the sequence of calibration data to yield a respective AM/PM distortion value for each calibration amplitude/gain value. The comparison results for multiple input and corresponding demodulated data samples corresponding to the same calibration amplitude/gain value may be averaged and/or filtered to reduce measurement noise. After AM/PM distortion values are determined for the range of possible calibration amplitude/gain values, the example AM/PM distortion response evaluator 336 stores the determined AM/PM distortion values in the example calibration storage unit 340.

To generate AM and PM predistortion values to counteract the determined AM/AM and AM/PM distortion characteristics of the example DPA 110, the example predistortion calibrator 148 of FIG. 3 includes an AM/AM predistortion determiner 344 and an AM/PM predistortion determiner 348, respectively. In the illustrated example, the example AM/AM predistortion determiner 344 operates to generate an AM predistortion value corresponding to each calibration amplitude/gain value of the sequence of input calibration data generated by the example calibration sequence generator 312. The example AM/AM predistortion determiner 344 performs this operation for all calibration amplitude/gain values and stores the resulting determined AM predistortion values in the example calibration storage unit 340.

Similarly, the example AM/PM predistortion determiner 348 operates to generate a PM predistortion value corresponding to each calibration amplitude/gain value of the sequence of input calibration data generated by the example calibration sequence generator 312. In an example implementation, to generate the PM predistortion value for a particular desired calibration amplitude/gain value, the example AM/PM predistortion determiner 348 retrieves the determined AM/PM distortion value corresponding to the desired calibration amplitude/gain value from the example calibration storage unit 340. The example AM/PM predistortion determiner 348 then sets the PM predistortion value for the particular desired calibration amplitude/gain value to be the negative of the retrieved AM/PM distortion value (because after distortion by the example DPA 110, a phase error corresponding to the retrieved AM/PM distortion value will be introduced to the signal being transmitted). The example AM/PM predistortion determiner 348 repeats these operations for all calibration amplitude/gain values and stores the resulting determined PM predistortion values in the example calibration storage unit 340.

The example predistortion calibrator 148 of FIG. 3 also includes a LUT updater 352 providing a LUT output 356 to store the generated AM and PM predistortion values in a LUT for use in linearizing a subject DPA. In an example operation, the LUT updater 352 operates to retrieve the generated AM and PM predistortion values from the example calibration storage unit 340. The example LUT updater 352 then stores the retrieved AM and PM predistortion values via the LUT output 356 in one or more appropriate LUTs, such as the example LUTs 112 of the example communication transceiver 100 and/or the example AM/AM LUT 228 and the example AM/PM LUT 236 of FIG. 2.

While an example manner of implementing the predistortion calibrator 148 of FIG. 1 has been illustrated in FIG. 3, one or more of the elements, processes and/or devices illustrated in FIG. 3 may be combined, divided, re-arranged, omitted, eliminated and/or implemented in any other way. Further, the example PA controller 304, the example calibration sequence generator 312, the example RX data converter 320, the example DC offset corrector 328, the example AM/AM distortion response evaluator 332, the example AM/PM distortion response evaluator 336, the example AM/AM predistortion determiner 344, the example AM/PM predistortion determiner 348, the example LUT updater 352 and/or, more generally, the example predistortion calibrator 148 of FIG. 3 may be implemented by hardware, software, firmware and/or any combination of hardware, software and/or firmware. Thus, for example, any of the example PA controller 304, the example calibration sequence generator 312, the example RX data converter 320, the example DC offset corrector 328, the example AM/AM distortion response evaluator 332, the example AM/PM distortion response evaluator 336, the example AM/AM predistortion determiner 344, the example AM/PM predistortion determiner 348, the example LUT updater 352 and/or, more generally, the example predistortion calibrator 148 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the appended claims are read to cover a purely software and/or firmware implementation, at least one of the example predistortion calibrator 148, the example PA controller 304, the example calibration sequence generator 312, the example RX data converter 320, the example DC offset corrector 328, the example AM/AM distortion response evaluator 332, the example AM/PM distortion response evaluator 336, the example AM/AM predistortion determiner 344, the example AM/PM predistortion determiner 348 and/or the example LUT updater 352 are hereby expressly defined to include a tangible medium, such as a memory, storing such software and/or firmware. Further still, the example predistortion calibrator 148 of FIG. 3 may include one or more elements, processes and/or devices in addition to, or instead of, those illustrated in FIG. 3, and/or may include more than one of any or all of the illustrated elements, processes and devices.

A block diagram of an example implementation of the predistortion compensator 150 included in the example communication transceiver 100 of FIG. 1 is illustrated in FIG. 4. In the illustrated example of FIG. 4, the example predistortion compensator 150 includes a PA controller 404, a PA control output 408, an RX data converter 420, an RX data input 424, and a DC offset corrector 428 which are similar to their respective counterparts included in the example predistortion calibrator 148. For example, the PA controller 404, the PA control output 408, the RX data converter 420, the RX data input 424, and the DC offset corrector 428 of FIG. 4 may be implemented by or may be similar duplicates of the respective PA controller 304, PA control output 308, RX data converter 320, and RX data input 324, and DC offset corrector 328 of FIG. 3. Accordingly, in the interest of brevity, the PA controller 404, the PA control output 408, the RX data converter 420, the RX data input 424, and the DC offset corrector 428 are not described further herein and, instead, reference is made to the descriptions of their respective counterpart elements provided above in connection with the discussion of FIG. 3.

In addition to the foregoing elements, the example predistortion compensator 150 of FIG. 4 includes a compensation sequence generator 432 to generate a sequence of input compensation data for use is in performing predistortion compensation to update the AM and PM predistortion values to be used for DPA linearization. The example predistortion compensation sequence generator 432 operates to generate a sequence of input compensation data having compensation amplitude (or gain) values that span, for example, all or a particular (e.g., critical) subset of the operating range of the example DPA 110 to be linearized (e.g., such as a subset of the operating range known to experience highly variable distortion characteristics). As discussed above, the example compensation sequence generator 432 may repeat the sequence of input compensation data to allow averaging over multiple data samples and/or other filtering techniques to be used to mitigate measurement noise when estimating the distortion parameter(s) characterizing the example DPA 110. In an example implementation, the sequence of input compensation data may be a staircase-like signal covering the range of compensation amplitude/gain values used during predistortion compensation.

Additionally, the example compensation sequence generator 432 may be configured to generate an initial sequence of zero values to allow DC offset correction to be performed prior to application of the sequence of input compensation data. Such DC offset correction can improve accuracy of the estimated distortion parameter(s). To apply the generated sequence of input compensation data, as well as the generated initial sequence of zero values if appropriate, to the example DPA 110, the example compensation sequence generator 432 provides a sequence generator output 436 for coupling to the DPA amplitude control input 152 of the example communication transceiver 100. Such a configuration allows the example compensation sequence generator 432 to directly control the sequence of compensation data (e.g., amplitude/gain values) applied to the gain input (or amplitude control word input) of the example DPA 110.

The example predistortion compensator 150 of FIG. 4 also includes an AM/AM distortion parameter estimator 440 and an AM/PM distortion parameter estimator 444 to determine the AM/AM distortion parameter(s) and AM/PM distortion parameter(s), respectively, of the parametric expression(s) being used to characterize the AM/AM and AM/PM distortion exhibited by the subject DPA, such as the example DPA 110 included in the example communication transceiver 100. In particular, the example AM/AM distortion parameter estimator 440 operates to process the demodulated magnitude data provided by the example RX data converter 420 to estimate the AM/AM distortion parameter(s) of the parametric expression(s) characterizing the AM/AM distortion exhibited by the DPA 110. Additionally, the example AM/PM distortion parameter estimator 444 operates to process the demodulated phase data provided by the example RX data converter 420 to estimate the AM/PM distortion parameter(s) of the parametric expression(s) characterizing the AM/PM distortion exhibited by the DPA 110. For example, the AM/AM distortion parameter estimator 440 and/or the AM/PM distortion parameter estimator 444 may use one or more statistical estimate techniques, such as least squares polynomial or other curve fitting techniques, to estimate their respective distortion parameter(s) according to the type of parametric expression(s) used to characterize the AM/AM and AM/PM distortion exhibited by the DPA 110. Example types of parametric expression(s) include polynomial or other functional approximations, possibly along with multi-segment approximation, representing the AM/AM and AM/PM distortion relative to input DPA amplitude. The example AM/AM distortion parameter estimator 440 and the example AM/PM distortion parameter estimator 444 then store their respective estimated AM/AM distortion parameter(s) and AM/PM distortion parameter(s) in a compensation storage unit 448. The example compensation storage unit 448 may be implemented by any type of storage unit, memory elements, digital logic, or the like.

The example predistortion compensator 150 of FIG. 4 further includes an AM/AM distortion expression evaluator 452 and an AM/PM distortion expression evaluator 456 to evaluate the parametric expression(s) characterizing the AM/AM and AM/PM distortion exhibited by the DPA 110 using the estimated AM/AM distortion parameter(s) and AM/PM distortion parameter(s) stored in the example compensation storage unit 448. In an example implementation, the AM/AM distortion expression evaluator 452 operates to retrieve the estimated AM/AM distortion parameter(s) from the example compensation storage unit 448 and then evaluate the corresponding AM/AM distortion parametric expression(s) for each compensation amplitude/gain value included in the sequence of compensation data generated by the example compensation sequence generator 432. After the AM/AM distortion parametric expression(s) are evaluated for all compensation amplitude/gain values, the resulting evaluated parametric expression values for AM/AM distortion are stored in the example compensation storage unit 448. Similarly, the example AM/PM distortion expression evaluator 456 operates to retrieve the estimated AM/PM distortion parameter(s) from the example compensation storage unit 448 and then evaluate the corresponding AM/PM distortion parametric expression(s) for each compensation amplitude/gain value included in the sequence of compensation data generated by the example compensation sequence generator 432. After the AM/PM distortion parametric expression(s) are evaluated for all compensation amplitude/gain values, the resulting evaluated parametric expression values for AM/PM distortion are stored in the example compensation storage unit 448.

To update the AM and PM predistortion values stored in one or more LUTs for use in linearizing a subject DPA, the example predistortion compensator 150 of FIG. 4 includes an AM/AM predistortion value updater 460, an AM/PM predistortion value updater 464 and a LUT updater 468. In the illustrated example, the LUT updater 468 is used by the example AM/AM predistortion value updater 460 and the example AM/PM predistortion value updater 464 to retrieve LUT entries via a LUT input/output (I/O) 472 from one or more LUTs, such as the example LUTs 112 of the example communication transceiver 100 and/or the example AM/AM LUT 228 and the example AM/PM LUT 236 of FIG. 2. The example AM/AM predistortion value updater 460 and the example AM/PM predistortion value updater 464 also use the example LUT updater 468 to store the updated LUT entries via the example LUT I/O 472 to the one or more LUTs.

In an example operation, the example AM/AM predistortion value updater 460 commands the example LUT updater 468 to retrieve an LUT entry corresponding to a particular desired compensation amplitude/gain value. The AM/AM predistortion value updater 460 then uses the evaluated parametric expression values for AM/AM distortion stored in the example compensation storage unit 448 to update the retrieved LUT entry. For example, the AM/AM predistortion value updater 460 may replace the AM predistortion value included in the LUT entry with a corresponding value retrieved from the example compensation storage unit 448. Alternatively, the AM/AM predistortion value updater 460 may use leaky averaging and/or other filtering, such as auto regressive (AR) and/or moving average (MA) filtering, to update the AM predistortion value included in the LUT entry with corresponding values retrieved from the example compensation storage unit 448. After replacing/updating the AM predistortion value included in the LUT entry, the example AM/AM predistortion value updater 460 commands the example LUT updater 468 to update the LUT entry in the appropriate LUT(s).

Similarly, in an example operation, the example AM/PM predistortion value updater 464 commands the example LUT updater 468 to retrieve an LUT entry corresponding to a particular desired compensation amplitude/gain value. The AM/PM predistortion value updater 464 then uses the evaluated parametric expression values for AM/PM distortion stored in the example compensation storage unit 448 to update the retrieved LUT entry. For example, the AM/PM predistortion value updater 464 may replace the PM predistortion value included in the LUT entry with a corresponding value retrieved from the example compensation storage unit 448. Alternatively, the AM/PM predistortion value updater 464 may use leaky averaging and/or other filtering, such as AR and/or MA filtering, to update the PM predistortion value included in the LUT entry with corresponding values retrieved from the example compensation storage unit 448. After replacing/updating the PM predistortion value included in the LUT entry, the example AM/PM predistortion value updater 464 commands the example LUT updater 468 to update the LUT entry in the appropriate LUT(s)

While an example manner of implementing the predistortion compensator 150 of FIG. 1 has been illustrated in FIG. 4, one or more of the elements, processes and/or devices illustrated in FIG. 4 may be combined, divided, re-arranged, omitted, eliminated and/or implemented in any other way. Further, the example PA controller 404, the example RX data converter 420, the example DC offset corrector 428, the example compensation sequence generator 432, the example AM/AM distortion parameter estimator 440, the example AM/PM distortion parameter estimator 444, the example AM/AM distortion expression evaluator 452, the example AM/PM distortion expression evaluator 456, the example AM/AM predistortion value updater 460, the example AM/PM predistortion value updater 464, the example LUT updater 468 and/or, more generally, the example predistortion compensator 150 of FIG. 4 may be implemented by hardware, software, firmware and/or any combination of hardware, software and/or firmware. Thus, for example, any of the example RX data converter 420, the example DC offset corrector 428, the example compensation sequence generator 432, the example AM/AM distortion parameter estimator 440, the example AM/PM distortion parameter estimator 444, the example AM/AM distortion expression evaluator 452, the example AM/PM distortion expression evaluator 456, the example AM/AM predistortion value updater 460, the example AM/PM predistortion value updater 464, the example LUT updater 468 and/or, more generally, the example predistortion compensator 150 could be implemented by one or more circuit(s), programmable processor(s), application specific integrated circuit(s) (ASIC (s)), programmable logic device(s) (PLD(s)) and/or field programmable logic device(s) (FPLD(s)), etc. When any of the appended claims are read to cover a purely software and/or firmware implementation, at least one of the example predistortion compensator 150, the example RX data converter 420, the example DC offset corrector 428, the example compensation sequence generator 432, the example AM/AM distortion parameter estimator 440, the example AM/PM distortion parameter estimator 444, the example AM/AM distortion expression evaluator 452, the example AM/PM distortion expression evaluator 456, the example AM/AM predistortion value updater 460, the example AM/PM predistortion value updater 464 and/or the example LUT updater 468 are hereby expressly defined to include a tangible medium, such as a memory, storing such software and/or firmware. Further still, the example predistortion compensator 150 of FIG. 4 may include one or more elements, processes and/or devices in addition to, or instead of, those illustrated in FIG. 4, and/or may include more than one of any or all of the illustrated elements, processes and devices.

Figure 5:
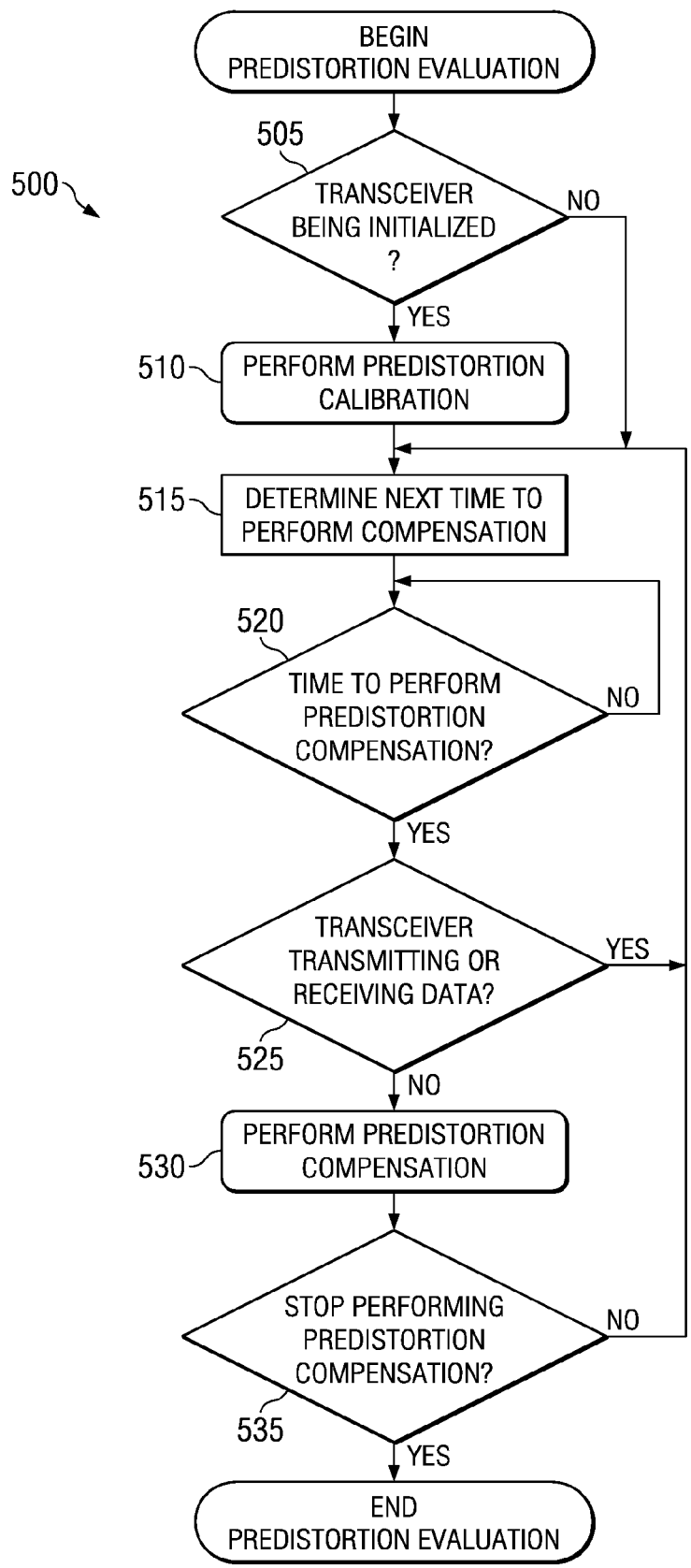
FIG. 5 is a flowchart representative of an example process for performing predistortion evaluation that may be performed to implement the example communication transceiver of FIG. 1.
Figure 6:
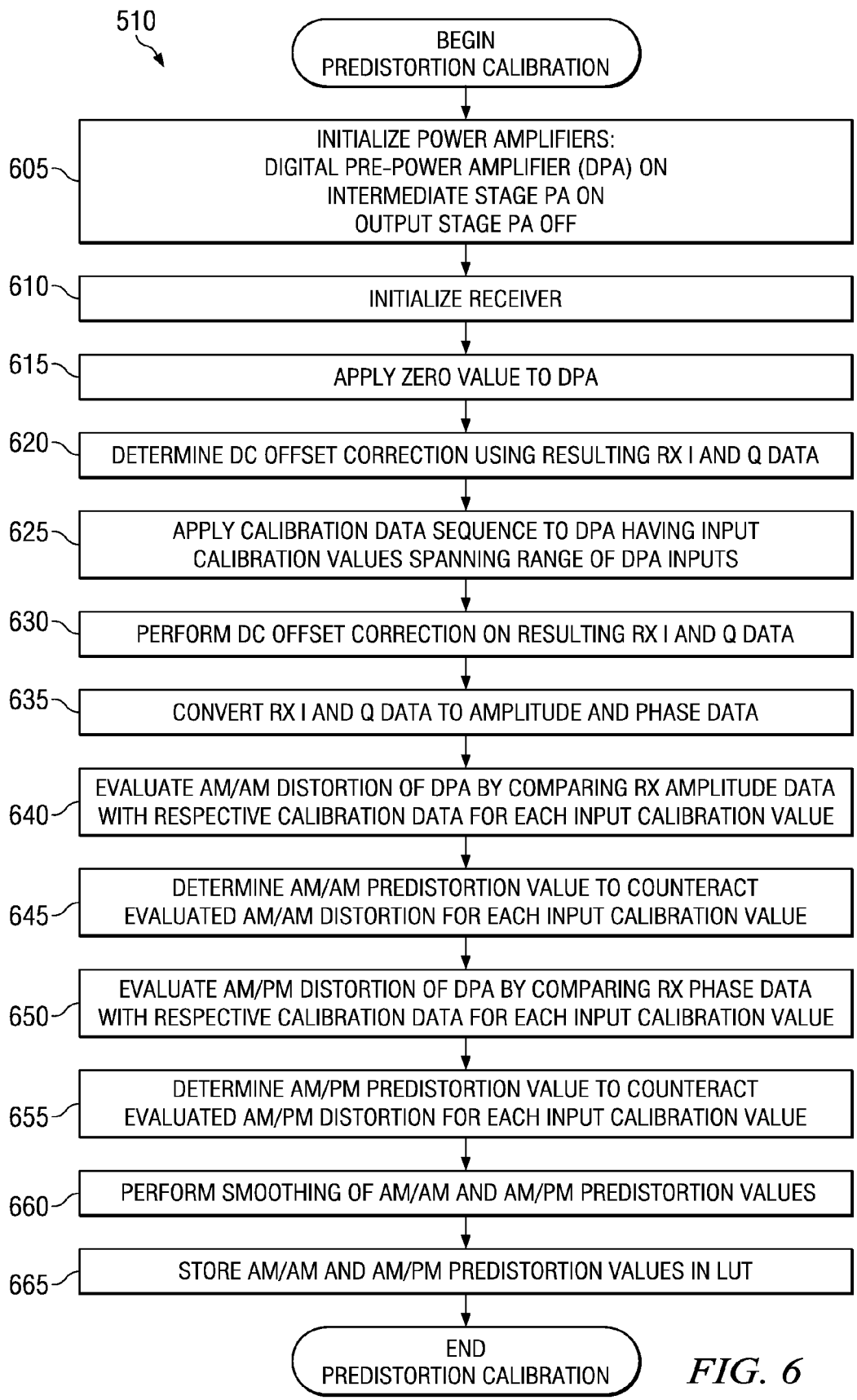
FIG. 6 is a flowchart representative of an example process for performing predistortion calibration that may be used to implement the example process of FIG. 5 and/or that may be executed to implement the example predistortion calibrator of FIG. 3.
Figure 7:
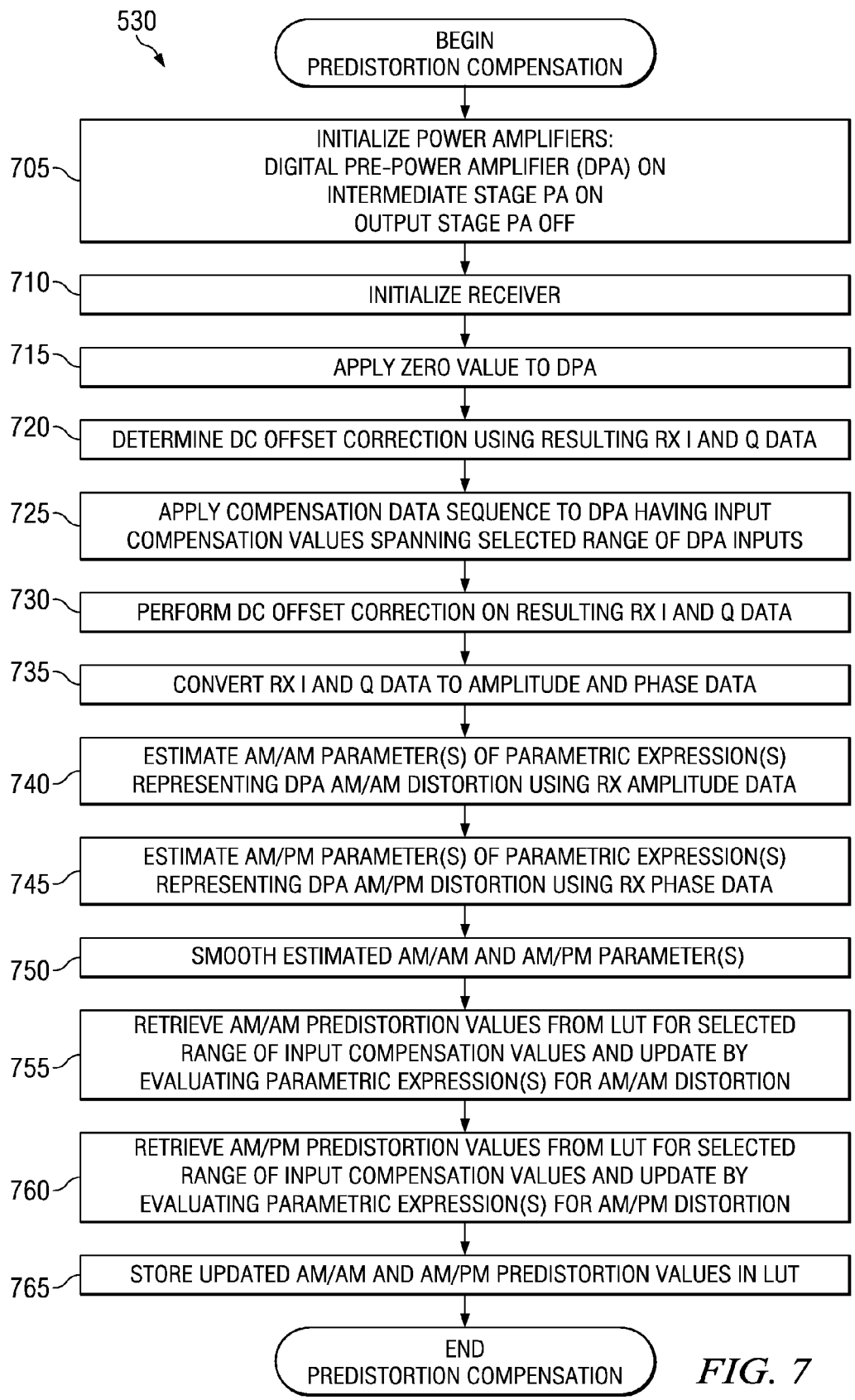
FIG. 7 is a flowchart representative of an example process for performing predistortion compensation that may be used to implement the example process of FIG. 5 and/or that may be executed to implement the example predistortion compensator of FIG. 4.

Flowcharts representative of example processes that may be executed to implement the example communication transceiver 100, the example transmitter 102, the example CORDIC unit 106, the example predistorter 108, the example DPA 110, the example LUT(s) 112, the example interpolation filter 114, the example $\Sigma\Delta$ modulator 116, the example ADPLL 118, the example multi-stage PA 120, the example PA stages 122, 124 and 126, the example T/R switch 128, the example receiver 130, the example front end receive filter 132, the example LNA 134, the example demodulator 136, the example DC offset compensator 138, the example script processor 140, the example predistortion evaluator 142, the example internal coupling path 144, the example predistortion calibrator 148, the example predistortion compensator 150, the example AM/AM predistorter 204, the example AM/PM predistorter 216, the example AM/AM LUT 228, the example AM/PM LUT 236, the example PA controller 304, the example calibration sequence generator 312, the example RX data converter 320, the example DC offset corrector 328, the example AM/AM distortion response evaluator 332, the example AM/PM distortion response evaluator 336, the example AM/AM predistortion determiner 344, the example AM/PM predistortion determiner 348, the example LUT updater 352, the example PA controller 404, the example RX data converter 420, the example DC offset corrector 428, the example compensation sequence generator 432, the example AM/AM distortion parameter estimator 440, the example AM/PM distortion parameter estimator 444, the example AM/AM distortion expression evaluator 452, the example AM/PM distortion expression evaluator 456, the example AM/AM predistortion value updater 460, the example AM/PM predistortion value updater 464 and/or the example LUT updater 468, and/or to control some or all of the aforementioned elements, are shown in FIGS. 5-7. In these examples, the process represented by each flowchart may be implemented by one or more programs comprising machine readable instructions for execution by: (a) a processor, such as a processor implementing Texas Instruments DRP™ technology, (b) a controller, and/or (c) any other suitable device. The one or more programs may be embodied in software stored on a tangible medium such as, for example, a flash memory, a CD-ROM, a floppy disk, a hard drive, a DVD, or a memory associated with a processor, but the entire program or programs and/or portions thereof could alternatively be executed by a device other than a processor and/or embodied in firmware or dedicated hardware (e.g., implemented by an application specific integrated circuit (ASIC), a programmable logic device (PLD), a field programmable logic device (FPLD), discrete logic, etc.). For example, any or all of the example communication transceiver 100, the example transmitter 102, the example CORDIC unit 106, the example predistorter 108, the example DPA 110, the example LUT(s) 112, the example interpolation filter 114, the example $\Sigma\Delta$ modulator 116, the example ADPLL 118, the example multi-stage PA 120, the example PA stages 122, 124 and 126, the example T/R switch 128, the example receiver 130, the example front end receive filter 132, the example LNA 134, the example demodulator 136, the example DC offset compensator 138, the example script processor 140, the example predistortion evaluator 142, the example internal coupling path 144, the example predistortion calibrator 148, the example predistortion compensator 150, the example AM/AM predistorter 204, the example AM/PM predistorter 216, the example AM/AM LUT 228, the example AM/PM LUT 236, the example PA controller 304, the example calibration sequence generator 312, the example RX data converter 320, the example DC offset corrector 328, the example AM/AM distortion response evaluator 332, the example AM/PM distortion response evaluator 336, the example AM/AM predistortion determiner 344, the example AM/PM predistortion determiner 348, the example LUT updater 352, the example PA controller 404, the example RX data converter 420, the example DC offset corrector 428, the example compensation sequence generator 432, the example AM/AM distortion parameter estimator 440, the example AM/PM distortion parameter estimator 444, the example AM/AM distortion expression evaluator 452, the example AM/PM distortion expression evaluator 456, the example AM/AM predistortion value updater 460, the example AM/PM predistortion value updater 464 and/or the example LUT updater 468 could be implemented by any combination of software, hardware, and/or firmware. Also, some or all of the processes represented by the flowcharts of FIGS. 5-7 may be implemented manually. Further, although the example processes are described with reference to the flowcharts illustrated in FIGS. 5-7, many other techniques for implementing the example methods and apparatus described herein may alternatively be used. For example, with reference to the flowcharts illustrated in FIGS. 5-7, the order of execution of the blocks may be changed, and/or some of the blocks described may be changed, eliminated, combined and/or subdivided into multiple blocks.

An example predistortion evaluation process 500 that may be executed to implement the example predistortion evaluator 142 of FIG. 1 is illustrated in FIG. 5. The example process 500 may be initiated, for example, when the example communication transceiver 100 activated, such as when the transceiver 100 is first powered ON, woken from a sleep mode, etc. For convenience and without loss of generality, the example predistortion evaluation process 500 is described in the context of execution in the example communication transceiver 100 of FIG. 1. Turning to FIG. 5, and with reference to FIG. 1, the example process 500 begins execution at block 505 at which the example predistortion evaluator 142 determines whether the example communication transceiver 100 is undergoing an initialization procedure, such as when the transceiver 100 is first powered ON. For example, the predistortion evaluator 142 may consult certain specified status registers, state variables, etc., accessed and/or maintained by the example script processor 140 to determine whether the example communication transceiver 100 is undergoing initialization. If the example predistortion evaluator 142 determines that the example communication transceiver 100 is currently being initialized (block 505), control proceeds to block 510; otherwise control proceeds to block 515.

At block 510, the example predistortion evaluator 142 performs a predistortion calibration procedure to generate AM and PM predistortion values for use by the example predistorter 108 to linearize the example DPA 110. For example, at block 510 the example predistortion evaluator 142 may invoke the example predistortion calibrator 148 to perform an example calibration procedure implementing an exhaustive determination of the AM/AM and AM/PM distortion characteristics of the example DPA 110 for most, if not all, of the range of amplitude/gain values supported by the DPA 110. The example predistortion calibrator 148 then uses the determined AM/AM and AM/PM distortion characteristics to generate respective AM and PM predistortion values for the calibration amplitude/gain values for which distortion characteristics were determined. The AM and PM predistortion values are then stored by the example predistortion calibrator 148 in the example LUT(s) 112 for use by the example predistorter 108 to linearize the example DPA 110. An example predistortion calibration process that may used to implement the processing at block 510 is illustrated in FIG. 6 and discussed in greater detail below.

Next, after predistortion calibration processing completes at block 510, or if the example communication transceiver 100 is not currently being initialized (block 505), control proceeds to block 515. At block 515, the example predistortion evaluator 142 determines the next time at which the AM and PM predistortion values are to be updated (e.g., compensated) by a predistortion compensation procedure. For example, predistortion compensation may be scheduled to be performed on a regular basis to allow the AM and PM predistortion values to be updated to compensate for operating temperature, aging, or any other variation of the example DPA 110.

After determining at block 515 the next time to perform predistortion compensation, control proceeds to block 520 at which the example predistortion evaluator 142 determines whether it is time to perform predistortion compensation. For example, at block 520 the example predistortion evaluator 142 may determine whether the time determined at block 515 has elapsed. If it is time to perform predistortion compensation (block 520), control proceeds to block 525 at which the example predistortion evaluator 142 determines whether the example communication transceiver 100 is in the process of transmitting or receiving data. For example, the predistortion evaluator 142 may consult certain specified status registers, state variables, etc., accessed and/or maintained by the example script processor 140 to determine whether either or both of the example transmitter 102 and the example receiver 130 of the example communication transceiver 100 are actively processing data for transmission or reception, respectively. If the example predistortion evaluator 142 determines that the example communication transceiver 100 is currently transmitting or receiving data (block 525), control returns to block 515 at which the example predistortion evaluator 142 determines a next time to perform predistortion compensation. For example, the predistortion evaluator 142 may determine a backoff interval at block 515 which specifies an interval of time to wait before attempting to perform calibration compensation again.

However, if the example predistortion evaluator 142 determines that the example communication transceiver 100 is not currently transmitting or receiving data (block 525), control proceeds to block 530 at which the example predistortion evaluator 142 performs a predistortion compensation procedure to update the AM and PM predistortion values being used by the example predistorter 108 to linearize the example DPA 110. For example, at block 530 the example predistortion evaluator 142 may invoke the example predistortion compensator 150 to perform an example compensation procedure implementing a less intensive parametric estimation of the AM/AM and AM/PM distortion characteristics of the example DPA 110 for a particular (e.g., critical) subset of the range of amplitude/gain values supported by the DPA 110 (e.g., such as a subset of the operating range known to experience highly variable distortion characteristics). The example predistortion compensator 150 then uses the parametric estimation of the AM/AM and AM/PM distortion characteristics to update the respective AM and PM predistortion values for the compensation amplitude/gain values for which the parametric estimation of the distortion characteristics was performed. The updated AM and PM predistortion values are then stored by the example predistortion compensator 150 in the example LUT(s) 112 for use by the example predistorter 108 to continue linearizing the example DPA 110. An example predistortion compensation process that may used to implement the processing at block 530 is illustrated in FIG. 7 and discussed in greater detail below.

After predistortion compensation processing completes at block 530, control proceeds to block 535 at which the example predistortion evaluator 142 determines whether the example communication transceiver 100 is to stop performing predistortion compensation. For example, at block 535 the predistortion evaluator 142 may consult certain specified status registers, state variables, etc., accessed and/or maintained by the example script processor 140 to determine whether a power OFF command has been detected by the example communication transceiver 100, thus requiring the example transceiver 100 to stop all processing, including predistortion compensation processing, in an orderly manner. If the example communication transceiver 100 is not to stop performing predistortion compensation or, in other words, if predistortion compensation processing is to continue (block 535), control returns to block 515 and blocks subsequent thereto at which the example predistortion evaluator 142 determines the next time at which predistortion compensation is to be performed. In this way, subsequent predistortion compensation processing may be performed, for example, at regular or other specified intervals to allow new or updated estimation of the distortion parameter(s) and reevaluation of the parametric expression(s) characterizing DPA distortion to allow the AM and PM predistortion parameters to be updated continually. If, however, the example communication transceiver 100 is to stop performing predistortion compensation, execution of the example predistortion evaluation process 500 then ends.

An example predistortion calibration process 510 that may be used to implement the processing at block 510 FIG. 5 and/or the example predistortion calibrator 148 of FIGS. 1 and/or 3 is illustrated in FIG. 6. For convenience and without loss of generality, the example predistortion calibration process 510 is described in the context of execution by the example predistortion calibrator 148 of FIG. 3 in the example communication transceiver 100 of FIG. 1. Turning to FIG. 6, and with reference to FIGS. 1 and 3, the example predistortion calibration process 510 begins execution at block 605 at which the example predistortion calibrator 148 invokes the example PA controller 304 to enable one or more of the intermediate PA stages 124 and 126 included in the example front end 101 coupled to the example communication transceiver 100, while disabling the example output PA stage 122 included in the front end 101. As discussed above, such a configuration allows the example internal coupling path 144 to internally couple the example DPA 110 and the example LNA 134 of the example communication transceiver 100 with proper loading of the DPA 110 but without causing signal emission from the example antenna 104.

Next, control proceeds to block 610 at which the example predistortion calibrator 148 initializes the example receiver 130 of the example communication transceiver 100 to begin receiver and demodulator processing. For example, at block 610 the example predistortion calibrator 148 may invoke the example script processor 140 to send commands, configure control registers, set state variables, etc., to configure some or all of the example LNA 134, the example demodulator 136 and/or the example DC offset compensator 138 to allow the receiver 130 to begin receiving and demodulating information bearing signals. After the receiver 130 is configured at block 610, control proceeds to block 615 at which the example predistortion calibrator 148 invokes the example calibration sequence generator 312 to generate one or a sequence of zero values to be applied to the DPA amplitude control input 152 controlling the example DPA 110. Then, at block 620, the example DC offset compensator 138 and/or the DC offset corrector 328 of the example predistortion calibrator 148 may use the demodulated I and Q samples output by the example demodulator 136 and resulting from the zero value(s) applied to the example DPA 110 at block 615 to perform DC offset estimation in preparation for subsequent correction of the received predistortion calibration data.

Control next proceeds to block 625 at which the example predistortion calibrator 148 invokes the example calibration sequence generator 312 to generate a sequence of input calibration data having calibration amplitude (or gain) values that span some or all of the operating range of the example DPA 110. The sequence of input calibration data is applied to the DPA amplitude control input 152 controlling the example DPA 110. Then, at block 630 the example DC offset compensator 138 and/or the DC offset corrector 328 of the example predistortion calibrator 148 perform DC offset correction of the received calibration data obtained by looping back the example DPA 110 to the example LNA 134 via the internal coupling path 144 configured at block 605. In this way, the demodulated I and Q calibration data output by the example demodulator 136 is corrected for DC offset.

Next, at block 635 the example predistortion calibrator 148 invokes the RX data converter 320 to convert the demodulated I and Q calibration data obtained from the example demodulator 136 to a polar representation yielding demodulated magnitude and phase calibration data. Then, at block 640 the example predistortion calibrator 148 invokes the example AM/AM distortion response evaluator 332 to compare the demodulated magnitude data obtained at block 635 with the respective input calibration data applied to the example DPA 110 at block 625 to determine the AM/AM distortion introduced by the example DPA 110. As discussed above, comparisons may be performed for each calibration amplitude/gain value included in the sequence of calibration data to yield a respective AM/AM distortion value for each calibration amplitude/gain value. Additionally or alternatively, one or more parametric expressions having one or more distortion parameters that are estimated using the demodulated magnitude data obtained at block 635 could be used at block 640 to determine AM/AM distortion values for respective calibration amplitude/gain values.

Next, at block 645 the example predistortion calibrator 148 invokes the example AM/AM predistortion determiner 344 to generate an AM predistortion value corresponding to each calibration amplitude/gain value for which a respective AM/AM distortion value was determined at block 640. For example, at block 645 the example AM/AM predistortion determiner 344 may generate an AM predistortion value corresponding to a particular desired calibration amplitude/gain value to be a value that counteracts the AM/AM distortion determined at block 640 to be exhibited by the example DPA 110 for that particular desired calibration amplitude/gain value.

At blocks 650 and 655, the example predistortion calibrator 148 next performs processing to determine the AM/PM distortion exhibited by the example DPA 110 and to generate PM distortion values to counteract the determined AM/PM distortion. In particular, at block 650 the example predistortion calibrator 148 invokes the example AM/PM distortion response evaluator 336 to compare the demodulated phase data obtained at block 635 with the respective phases of input calibration data applied to the example DPA 110 at block 625 to determine the AM/PM distortion introduced by the example DPA 110. As discussed above, comparisons may be performed for each calibration amplitude/gain value included in the sequence of calibration data to yield a respective AM/PM distortion value for each calibration amplitude/gain value. Additionally or alternatively, one or more parametric expressions having one or more distortion parameters that are estimated using the demodulated phase data obtained at block 635 could be used at block 650 to determine AM/PM distortion values for respective calibration amplitude/gain values.

Then, at block 655 the example predistortion calibrator 148 invokes the example AM/PM predistortion determiner 348 to generate a PM predistortion value corresponding to each calibration amplitude/gain value for which a respective AM/PM distortion value was determined at block 650. For example, at block 655 the example AM/PM predistortion determiner 348 may generate a PM predistortion value corresponding to a particular desired calibration amplitude/gain value to be the negative of the AM/PM distortion determined at block 660 to be exhibited by the example DPA 110 for that particular desired calibration amplitude/gain value.

Next, at block 660 the example predistortion calibrator 148 performs smoothing on the AM predistortion values generated at block 645 and the PM predistortion values at block 655 to reduce measurement noise. For example, at block 625 the sequence of input calibration data may be repeatedly applied to the example DPA 110 to allow multiple AM and PM predistortion values to be generated for each possible calibration amplitude/gain value. In such an example, the multiple AM and PM predistortion values generated for a particular calibration amplitude/gain value may be averaged and/or otherwise filtered to yield a single AM and a single PM predistortion value for that particular calibration amplitude/gain value. After smoothing is performed at block 660, control proceeds to block 665 at which the example predistortion calibrator 148 invokes the example LUT updater 352 to store the generated (and smoothed) AM and PM predistortion values in the example LUTs 112 of the example communication transceiver 100 and/or the example AM/AM LUT 228 and the example AM/PM LUT 236 of FIG. 2. Execution of the example predistortion calibration procedure 510 then ends.

An example predistortion compensation process 530 that may be used to implement the processing at block 530 of FIG. 5 and/or the example predistortion compensator 150 of FIGS. 1 and/or 4 is illustrated in FIG. 7. For convenience and without loss of generality, the example predistortion compensation process 530 is described in the context of execution by the example predistortion compensator 150 of FIG. 4 in the example communication transceiver 100 of FIG. 1. Turning to FIG. 7, and with reference to FIGS. 1 and 4, the example predistortion compensation process 530 begins execution at block 705 at which the example predistortion compensator 150 invokes the example PA controller 404 to enable one or more of the intermediate PA stages 124 and 126 included in the example front end 101 coupled to the example communication transceiver 100, while disabling the example output PA stage 122 included in the front end 101. As discussed above, such a configuration allows the example internal coupling path 144 to internally couple the example DPA 110 and the example LNA 134 of the example communication transceiver 100 with proper loading of the DPA 110 but without causing signal emission from the example antenna 104.

Next, control proceeds to block 710 at which the example predistortion compensator 150 initializes the example receiver 130 of the example communication transceiver 100 to begin receiver and demodulator processing. For example, at block 710 the example predistortion compensator 150 may invoke the example script processor 140 to send commands, configure control registers, set state variables, etc., to configure some or all of the example LNA 134, the example demodulator 136 and/or the example DC offset compensator 138 to allow the receiver 130 to begin receiving and demodulating information bearing signals. After the receiver 130 is configured at block 710, control proceeds to block 715 at which the example predistortion calibrator 148 invokes the example compensation sequence generator 432 to generate one or a sequence of zero values to be applied to the DPA amplitude control input 152 controlling the example DPA 110. Then, at block 720, the example DC offset compensator 138 and/or the DC offset corrector 428 of the example predistortion compensator 150 may use the demodulated I and Q samples output by the example demodulator 136 and resulting from the zero value(s) applied to the example DPA 110 at block 715 to perform DC offset estimation in preparation for subsequent correction of received predistortion compensation data.

Control next proceeds to block 725 at which the example predistortion compensator 150 invokes the example compensation sequence generator 432 to generate a sequence of input compensation data having compensation amplitude (or gain) values that span all or a particular (e.g., critical) subset of the operating range of the example DPA 110 (e.g., such as a subset of the operating range known to experience highly variable distortion characteristics). The sequence of input compensation data is applied to the DPA amplitude control input 152 controlling the example DPA 110. Then, at block 730 the example DC offset compensator 138 and/or the DC offset corrector 428 of the example predistortion compensator 150 perform DC offset correction of the received compensation data obtained by looping back the example DPA 110 to the example LNA 134 via the internal coupling path 144 configured at block 705. In this way, the demodulated I and Q compensation data output by the example demodulator 136 is corrected for DC offset.

Next, at block 735 the example predistortion compensator 150 invokes the RX data converter 420 to convert the demodulated I and Q calibration data obtained from the example demodulator 136 to a polar representation yielding demodulated magnitude and phase calibration data. Then, at block 740 the example predistortion compensator 150 invokes the example AM/AM distortion parameter estimator 440 to process the demodulated magnitude data obtained at block 735 to estimate AM/AM distortion parameter(s) of parametric expression(s) characterizing the AM/AM distortion exhibited by the DPA 110. Additionally, at block 745 the example predistortion compensator 150 invokes the example AM/PM distortion parameter estimator 444 to process the demodulated phase data obtained at block 735 to estimate AM/PM distortion parameter(s) of parametric expression(s) characterizing the AM/PM distortion exhibited by the DPA 110. For example, at blocks 740 and/or 745, one or more statistical estimate techniques, such as least squares polynomial or other curve fitting techniques, may be used to estimate the respective AM/AM and AM/PM distortion parameter(s) according to the type of parametric expression(s) used to characterize the AM/AM and AM/PM distortion exhibited by the DPA 110. Example types of parametric expression(s) include polynomial or other functional approximations, possibly along with multi-segment approximation, representing the AM/AM and AM/PM distortion relative to the input gain/amplitude of the example DPA 110.

Next, at block 750 the example predistortion compensator 150 performs smoothing on the distortion parameter(s) estimated at blocks 740 and 745. For example, at block 725 the sequence of input compensation data may be repeatedly applied to the example DPA 110 to allow the distortion parameter(s) to be estimated multiple times at blocks 740 and 745. In such an example, the distortion parameter(s) may be averaged and/or otherwise filtered to yield single instances of the distortion parameter(s) for use in evaluating the corresponding parametric expressions characterizing the AM/AM and AM/PM distortion of the example DPA 110.

After smoothing is performed at block 750, control proceeds to block 755 at which the example predistortion compensator 150 invokes the example LUT updater 468 to retrieve existing AM predistortion values from the example LUTs 112 of the example communication transceiver 100 and/or the example AM/AM LUT 228 of FIG. 2. Additionally, at block 755 the example predistortion compensator 150 invokes the AM/AM distortion expression evaluator 452 to evaluate the appropriate AM/AM distortion parametric expression(s) using the parameters estimated at block 740 (and smoothed at block 750) for each AM predistortion value retrieved by the example LUT updater 468. Furthermore, at block 755 the example predistortion compensator 150 invokes the AM/AM predistortion value updater 460 to replace and/or use leaky averaging and/or other filtering to update each retrieved AM predistortion value using one or more values determined by evaluating the AM/AM distortion parametric expression(s).

Similarly, at block 760 the example predistortion compensator 150 invokes the example LUT updater 468 to retrieve existing PM predistortion values from the example LUTs 112 of the example communication transceiver 100 and/or the example AM/PM LUT 236 of FIG. 2. Additionally, at block 760 the example predistortion compensator 150 invokes the AM/PM distortion expression evaluator 456 to evaluate the appropriate AM/PM distortion parametric expression(s) using the parameters estimated at block 745 (and smoothed at block 750) for each PM predistortion value retrieved by the example LUT updater 468. Furthermore, at block 760 the example predistortion compensator 150 invokes the AM/PM predistortion value updater 464 to replace and/or use leaky averaging and/or other filtering to update each retrieved PM predistortion value using one or more values determined by evaluating the AM/PM distortion parametric expression(s).

After the retrieved AM and PM predistortion values are updated at blocks 755 and 760, respectively, control proceeds to block 765 at which the example predistortion compensator 150 invokes the example LUT updater 468 to store the updated AM and PM predistortion values in the appropriate LUT(s), such as in the example LUTs 112 of the example communication transceiver 100 and/or the example AM/AM LUT 228 and the example AM/PM LUT 236 of FIG. 2. Execution of the example predistortion calibration procedure 530 then ends Although certain example apparatus, methods, and articles of manufacture are described herein, other implementations are possible. The scope of coverage of this patent is not limited to the specific examples described herein. On the contrary, this patent covers all apparatus, methods, and articles of manufacture falling within the scope of the invention.

What is claimed is:

1. A method to perform predistortion to linearize a pre-power amplifier in a communication transceiver, the method comprising:

performing an initial calibration procedure to determine a plurality of predistortion values corresponding respectively to a plurality of input calibration values applied to the pre-power amplifier, wherein the plurality of predistortion values are stored in at least one look-up table and comprise a plurality of amplitude modulation (AM) predistortion values to counteract AM/AM distortion of an input signal by the pre-power amplifier and a plurality of phase modulation (PM) predistortion values to counteract AM/PM distortion of the input signal by the pre-power amplifier; and performing a subsequent compensation procedure to estimate a parameter of a parametric expression characterizing a distortion exhibited by the pre-power amplifier and to evaluate the parametric expression to update at least one of the plurality of predistortion values.

2. A method as defined in claim 1 further comprising-predistorting an input signal applied to the pre-power amplifier using the plurality of predistortion values.

3. A method as defined in claim 2 wherein the calibration procedure is performed during initialization of the communication transceiver and the compensation procedure is performed during normal operation of the communication transceiver.

4. A method to perform predistortion to linearize a pre-power amplifier in a communication transceiver, the method comprising:

performing an initial calibration procedure to determine a plurality of predistortion values corresponding respectively to a plurality of input calibration values applied to the pre-power amplifier, wherein performing the calibration procedure comprises:

coupling an output of the pre-power amplifier to an input of a receiver included in the communication transceiver;

determining a direct current (DC) offset correction for use by the receiver from first demodulated data resulting from applying a substantially zero value to the pre-power amplifier;

determining second demodulated data resulting from applying a sequence of input calibration data to the pre-power amplifier spanning the plurality of input calibration values;

applying the DC offset correction to the second demodulated data to determine corrected second demodulation data;

comparing the corrected second demodulation data to the sequence of input calibration data to determine a plurality of distortion values corresponding respectively to the plurality of input calibration values, wherein each distortion value represents a resulting distortion of a respective input calibration value by the pre-power amplifier; and determining the plurality of predistortion values based on the plurality of distortion values and the plurality of input calibration values to counteract distortion of each of the plurality of input calibration values by the pre-power amplifier; and performing a subsequent compensation procedure to estimate a parameter of a parametric expression characterizing a distortion exhibited by the pre-power amplifier and to evaluate the parametric expression to update at least one of the plurality of predistortion values.

5. A method as defined in claim 4 wherein the pre-power amplifier comprises a digitally controlled pre-power amplifier, and wherein coupling the output of the pre-power amplifier to the input of the receiver comprises at least one of using a leakage current or using a trace to couple the output of the digitally controlled pre-power amplifier to the input of the receiver without enabling an output power amplifier stage of a multi-stage power amplifier coupled to the digitally controlled pre-power amplifier.

6. A method to perform predistortion to linearize a pre-power amplifier in a communication transceiver, the method comprising:

performing an initial calibration procedure to determine a plurality of predistortion values corresponding respectively to a plurality of input calibration values applied to the pre-power amplifier; and performing a subsequent compensation procedure to estimate a parameter of a parametric expression characterizing a distortion exhibited by the pre-power amplifier and to evaluate the parametric expression to update at least one of the plurality of predistortion values, wherein performing the compensation procedure comprises:

coupling an output of the pre-power amplifier to an input of a receiver included in the communication transceiver;

determining a DC offset correction for use by the receiver from first demodulated data resulting from applying a substantially zero value to the pre-power amplifier;

determining second demodulated data resulting from applying a sequence of input compensation data to the pre-power amplifier spanning a plurality of compensation values comprising at least some of the plurality of input calibration values;

applying the DC offset correction to the second demodulated data to determine corrected second demodulation data;

estimating the parameter of the parametric expression characterizing the distortion exhibited by the pre-power amplifier from at least the corrected second demodulation data; and evaluating the parametric expression using the estimated parameter to update the at least one of the plurality of predistortion values.

7. A method as defined in claim 6 wherein the pre-power amplifier comprises a digitally controlled pre-power amplifier, and wherein coupling the output of the pre-power amplifier to the input of the receiver comprises at least one of using a leakage current or using a trace to couple the output of the digitally controlled pre-power amplifier to the input of the receiver without enabling an output power amplifier stage of a multi-stage power amplifier coupled to the digitally controlled pre-power amplifier.

8. A method to perform predistortion to linearize a pre-power amplifier in a communication transceiver, the method comprising:

performing an initial calibration procedure to determine a plurality of predistortion values corresponding respectively to a plurality of input calibration values applied to the pre-power amplifier; and performing a subsequent compensation procedure to estimate a parameter of a parametric expression characterizing a distortion exhibited by the pre-power amplifier and to evaluate the parametric expression to update at least one of the plurality of predistortion values, wherein the subsequent compensation procedure is a first subsequent compensation procedure and further comprising:

performing a second subsequent compensation procedure after the first subsequent compensation procedure to determine a new estimate of the parameter of the parametric expression; and reevaluating the parametric expression to update at least one of the plurality of predistortion values.

9. An apparatus to linearize a digitally controlled pre-power amplifier included in a transmitter of a communication transceiver, the apparatus comprising:

a predistorter to predistort an input signal to be processed by the digitally controlled pre-power amplifier;

a coupling path within the communication transceiver to couple an output of the digitally controlled pre-power amplifier to an input of a receiver included in the communication transceiver without enabling an output power amplifier stage included in a multi-stage power amplifier coupled to the output of the digitally controlled pre-power amplifier, wherein no additional hardware components are required to implement the coupling path within the communication transceiver; and a predistortion evaluator to process data demodulated by the receiver to determine predistortion values for use by the predistorter;

predistorting an input signal applied to the pre-power amplifier using the plurality of predistortion values, wherein predistorting the input signal comprises:

selecting a first predistortion value to represent a predistorted amplitude of the input signal to counteract AM/AM predistortion of the input signal by the pre-power amplifier;

selecting a second predistortion value to represent a predistorted phase of the input signal to counteract AM/PM predistortion of the input signal by the pre-power amplifier;

controlling a amplitude input of the pre-power amplifier using the first predistortion value; and controlling a phase input of a phase locked loop using the second predistortion value, wherein the phase locked loop is configured to drive the pre-power amplifier.

10. An apparatus to linearize a digitally controlled pre-power amplifier included in a transmitter of a communication transceiver, the apparatus comprising:

a predistorter to predistort an input signal to be processed by the digitally controlled pre-power amplifier;

a coupling path within the communication transceiver to couple an output of the digitally controlled pre-power amplifier to an input of a receiver included in the communication transceiver without enabling an output power amplifier stage included in a multi-stage power amplifier coupled to the output of the digitally controlled pre-power amplifier, wherein no additional hardware components are required to implement the coupling path within the communication transceiver; and a predistortion evaluator to process data demodulated by the receiver to determine predistortion values for use by the predistorter.

11. An apparatus as defined in claim 10 wherein the coupling path comprises at least one of radiated coupling or conductive coupling.

12. An apparatus to linearize a digitally controlled pre-power amplifier included in a transmitter of a communication transceiver, the apparatus comprising:
- a predistorter to predistort an input signal to be processed by the digitally controlled pre-power amplifier;
- a coupling path within the communication transceiver to couple an output of the digitally controlled pre-power amplifier to an input of a receiver included in the communication transceiver without enabling an output power amplifier stage included in a multi-stage power amplifier coupled to the output of the digitally controlled pre-power amplifier, wherein no additional hardware components are required to implement the coupling path within the communication transceiver, and wherein the coupling path is configured to couple the output of the digitally controlled pre-power amplifier to a low noise amplifier included in the receiver when one or more intermediate power amplifier stages coupling the digitally controlled pre-power amplifier with the output power amplifier stage are enabled; and
- a predistortion evaluator to process data demodulated by the receiver to determine predistortion values for use by the predistorter.

13. An apparatus as defined in claim 10 wherein the predistorter is configured to access a plurality of amplitude modulation (AM) predistortion values and a plurality of phase modulation (PM) predistortion values maintained by the predistortion evaluator to predistort an amplitude and a phase of the input signal.

14. An apparatus to linearize a digitally controlled pre-power amplifier included in a transmitter of a communication transceiver, the apparatus comprising:
- a predistorter to predistort an input signal to be processed by the digitally controlled pre-power amplifier;
- a coupling path within the communication transceiver to couple an output of the digitally controlled pre-power amplifier to an input of a receiver included in the communication transceiver without enabling an output power amplifier stage included in a multi-stage power amplifier coupled to the output of the digitally controlled pre-power amplifier, wherein no additional hardware components are required to implement the coupling path within the communication transceiver; and
- a predistortion evaluator to process data demodulated by the receiver to determine predistortion values for use by the predistorter, wherein the predistorter is configured to access a plurality of amplitude modulation (AM) predistortion values and a plurality of phase modulation (PM) predistortion values maintained by the predistortion evaluator to predistort an amplitude and a phase of the input signal; and
- wherein the predistorter is configured to control an amplitude input of the digitally controlled pre-power amplifier using a first AM predistortion value selected from the plurality of AM predistortion values based on the amplitude of the input signal to counteract AM/AM distortion of the input signal by the digitally controlled pre-power amplifier, and wherein the predistorter is configured to control a phase input of a phase locked loop driving the digitally controlled pre-power amplifier using a first PM predistortion value selected from the plurality of PM predistortion values based on the phase of the input signal to counteract AM/PM distortion of the input signal by the digitally controlled pre-power amplifier.

15. An apparatus to linearize a digitally controlled pre-power amplifier included in a transmitter of a communication transceiver, the apparatus comprising:
- a predistorter to predistort an input signal to be processed by the digitally controlled pre-power amplifier;
- a coupling path within the communication transceiver to couple an output of the digitally controlled pre-power amplifier to an input of a receiver included in the communication transceiver without enabling an output power amplifier stage included in a multi-stage power amplifier coupled to the output of the digitally controlled pre-power amplifier, wherein no additional hardware components are required to implement the coupling path within the communication transceiver; and
- a predistortion evaluator to process data demodulated by the receiver to determine predistortion values for use by the predistorter, wherein the predistortion evaluator comprises a predistortion calibrator to compare input calibration data having a plurality of input calibration values that is applied to the digitally controlled pre-power amplifier with corresponding received calibration data demodulated by the receiver from the coupling path during initialization of the communication transceiver to determine a plurality of predistortion values corresponding respectively to the plurality of input calibration values.

16. An apparatus as defined in claim 15 wherein the predistortion evaluator further comprises a predistortion compensator to estimate a parameter of a parametric expression characterizing a distortion exhibited by the digitally controlled pre-power amplifier from received compensation data corresponding to input compensation data applied to the digitally controlled pre-power amplifier and demodulated by the receiver from the coupling path during normal operation of the communication transceiver and to evaluate the parametric expression to update at least one of the plurality of predistortion values.

17. A communication transceiver implementing predistortion to linearize a digitally controlled pre-power amplifier included therein, the communication transceiver comprising:
- a transmitter comprising:
  - the digitally controlled pre-power amplifier configured to be coupled to a multi-stage power amplifier, the multi-stage power amplifier comprising an output power amplifier stage and at least one intermediate power amplifier stage coupling the digitally controlled pre-power amplifier with the output power amplifier stage to amplify an input signal applied to the digitally controlled pre-power amplifier for transmission by an antenna coupled to the output power amplifier stage; and
  - a predistorter to use at least one of a plurality of predistortion values to predistort the input signal applied to the digitally controlled pre-power amplifier to compensate for distortion of the input signal by the digitally controlled pre-power amplifier;
- a coupling path to couple the digitally controlled pre-power amplifier to a low noise amplifier to allow a receiver to demodulate an output of the digitally controlled pre-power amplifier without enabling the output power amplifier stage, wherein no additional hardware components are required to implement the coupling path and wherein the at least one intermediate power amplifier stage is enabled to load the digitally controlled pre-power amplifier; and
- a script processor to implement at least:

a predistortion calibrator to generate a look-up table comprising the plurality of predistortion values from received calibration data demodulated by the receiver and corresponding to input calibration data comprising a plurality of predistortion values to be applied to the digitally controlled pre-power amplifier and provided to the low noise amplifier by the coupling path; and a predistortion compensator to estimate a parameter of a parametric expression characterizing a distortion exhibited by the digitally controlled pre-power amplifier from received compensation data demodulated by the receiver and corresponding to input compensation data to be applied to the digitally controlled pre-power amplifier and provided to the low noise amplifier by the coupling path, the predistortion compensator to further evaluate the parametric expression to update at least one of the plurality of predistortion values determined by the predistortion calibrator.

18. A communication transceiver as defined in claim 17 wherein the coupling path comprises at least one of a leakage current or a trace.

19. A communication transceiver as defined in claim 17 wherein the predistortion calibrator is configured to operate during initialization of the communication transceiver, and the predistortion compensator is configured to operate during normal operation of the communication transceiver.

* * * * *